United States Patent
Numakura et al.

(10) Patent No.: US 9,166,933 B2
(45) Date of Patent: Oct. 20, 2015

(54) MEMORY CONTROL APPARATUS, INFORMATION PROCESSING APPARATUS, AND MEMORY CONTROL METHOD

(75) Inventors: Satoru Numakura, Miyagi (JP); Junichi Ikeda, Miyagi (JP); Mitsuru Suzuki, Miyagi (JP); Koji Takeo, Miyagi (JP); Tetsuya Satoh, Miyagi (JP); Hiroyuki Takahashi, Miyagi (JP)

(73) Assignee: RICOH COMPANY, LIMITED, Tokyo (JP)

(*) Notice: Subject to any disclaimer, the term of this patent is extended or adjusted under 35 U.S.C. 154(b) by 397 days.

(21) Appl. No.: 13/542,139

(22) Filed: Jul. 5, 2012

(65) Prior Publication Data

US 2013/0016726 A1 Jan. 17, 2013

(30) Foreign Application Priority Data

Jul. 11, 2011 (JP) ................. 2011-153339

(51) Int. Cl.
*G11C 7/10* (2006.01)
*H04L 12/861* (2013.01)
*G11C 8/16* (2006.01)
*G06F 7/00* (2006.01)
*H04L 12/879* (2013.01)

(52) U.S. Cl.
CPC ............. *H04L 49/9042* (2013.01); *G06F 7/00* (2013.01); *G11C 8/16* (2013.01); *H04L 49/901* (2013.01)

(58) Field of Classification Search
CPC ....... H04I 49/9042; H04I 49/901; G06F 7/00; G11C 8/16
USPC .............. 365/189.011, 189, 4, 220; 358/1.16, 358/1.17, 1.18
See application file for complete search history.

(56) References Cited

U.S. PATENT DOCUMENTS

| 5,638,534 | A  | * | 6/1997  | Mote, Jr. ................. 711/158 |
| 7,454,540 | B2 |   | 11/2008 | Oshikiri et al. |
| 7,536,489 | B2 |   | 5/2009  | Oshikiri et al. |
| 7,664,904 | B2 |   | 2/2010  | Oshikiri et al. |
| 7,698,484 | B2 |   | 4/2010  | Ikeda et al. |

(Continued)

FOREIGN PATENT DOCUMENTS

| JP | 2003-271445 | 9/2003 |
| JP | 2005-84907  | 3/2005 |

OTHER PUBLICATIONS

Office Action mailed Jan. 27, 2015, in Japanese Patent Application No. 2011-153339.

*Primary Examiner* — Ajay Cattungal
(74) *Attorney, Agent, or Firm* — Oblon, McClelland, Maier & Neustadt, L.L.P.

(57) ABSTRACT

A memory control apparatus that controls writing and reading of data to/from a memory. The memory control apparatus includes: a sequence control unit that receives a packet sequence including a write packet including a write request of data and a read packet including a read request of the data, and changes an arrangement of the write packet and the read packet included in the packet sequence so that a first predetermined number of write packets are arranged successively and a second predetermined number of read packets are arranged successively; and a command output unit that receives the packet sequence from the sequence control unit, and outputs a write command according to the write packet and an a read command according to the read packet to the memory, in accordance with an order of arrangement of the write packet and the read packet.

7 Claims, 19 Drawing Sheets

(56) References Cited

U.S. PATENT DOCUMENTS

| | | |
|---|---|---|
| 7,755,791 B2 | 7/2010 | Maita et al. |
| 7,779,187 B2 | 8/2010 | Ikeda et al. |
| 7,813,362 B2 * | 10/2010 | Ikeda et al. ............... 370/412 |
| 2005/0195902 A1 * | 9/2005 | Chung, II ............... 375/240.25 |
| 2005/0248584 A1 | 11/2005 | Takeo et al. |
| 2005/0254085 A1 * | 11/2005 | Oshikiri et al. ............ 358/1.15 |
| 2006/0114918 A1 | 6/2006 | Ikeda et al. |
| 2006/0187944 A1 | 8/2006 | Takeo et al. |
| 2006/0209722 A1 | 9/2006 | Takeo et al. |
| 2008/0016265 A1 | 1/2008 | Oshikiri et al. |
| 2009/0310413 A1 * | 12/2009 | Lasser ............... 365/185.12 |
| 2010/0046508 A1 * | 2/2010 | Vogel ............... 370/352 |
| 2010/0067042 A1 | 3/2010 | Ikeda et al. |
| 2010/0191918 A1 * | 7/2010 | Lee et al. ............... 711/137 |
| 2011/0096603 A1 * | 4/2011 | Lasser ............... 365/185.12 |
| 2011/0225341 A1 | 9/2011 | Satoh et al. |

* cited by examiner

☐ : READ PACKET

▭ : WRITE PACKET

☐ : READ PACKET

▭ : WRITE PACKET

▨ : TIME FOR WAITING FOR COMPLETION OF COMMAND RECEPTION

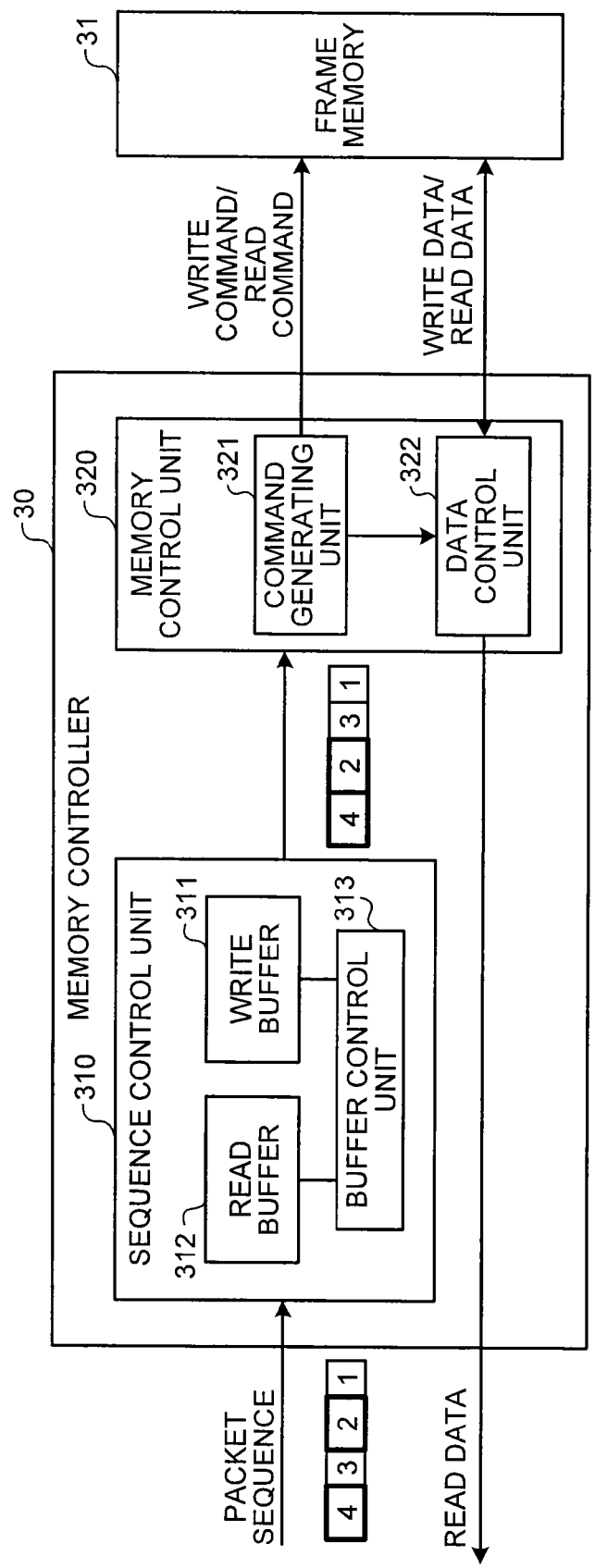

MEMORY CONTROL APPARATUS, INFORMATION PROCESSING APPARATUS, AND MEMORY CONTROL METHOD

CROSS-REFERENCE TO RELATED APPLICATIONS

The present application claims priority to and incorporates by reference the entire contents of Japanese Patent Application No. 2011-153339 filed in Japan on Jul. 11, 2011.

BACKGROUND OF THE INVENTION

1. Field of the Invention

The present invention relates to a memory control apparatus, an information processing apparatus, and a memory control method.

2. Description of the Related Art

When printing process is performed with image data in PDL (Page Description Language) format, the image data in the PDL format are expanded into image data in a raster format (hereinafter referred to as "raster image data"), and the printing process is performed based on the raster image data. The processing for generating the raster image data from the image data in the PDL format is called RIP (Raster Image Processing) processing. An image forming system for performing high-speed processing for large-volume printing businesses is likely to employ a configuration in which a DFE (Digital Front End) apparatus for performing the RIP processing and an image forming apparatus for printing an image onto paper, which is a recording medium, based on raster image data are separately provided. In this case, the DFE apparatus and the image forming apparatus are connected via a communication cable and the like, and the RIP-processed raster image data are transferred from the DFE apparatus to the image forming apparatus via information communication based on, for example, PCI Express (hereinafter referred to as "PCIe") standard.

In this kind of image forming system, a DDR-SDRAM (Double Data Rate-Synchronous Dynamic Random Access Memory) capable of achieving high-speed data transfer speed is often used as memory for temporarily storing raster image data transferred from the DFE apparatus to the image forming apparatus. The DDR-SDRAM (hereinafter abbreviated as "DDR") can exchange data both at the rising and the falling edges of a clock signal. Theoretically, the DDR provides a data transfer speed twice as fast as the data transfer speed of an SDRAM operating with the same clock.

Writing and reading of data to/from the DDR is achieved by access to a memory cell specified by two addresses, i.e., a row address and a column address. When the same row address is accessed successively at this occasion, writing and reading of data can be performed at a high speed. On the other hand, when a row address is switched frequently, and in particular, when data are written and read alternately by specifying different row addresses, it takes time to wait for completion of command reception every time writing and reading are switched, and this reduces the performance.

The above image forming system performs, in parallel, processing for transferring raster image data from the DFE apparatus to the image forming apparatus and writing the raster image data to the DDR and processing for printing an image based on the raster image data read from the DDR. Therefore, writing and reading of the raster image data to/from the DDR is alternately performed in a time division manner, and switching frequently occurs between writing and reading of data with different row addresses specified, and the data transfer efficiency is considered to decrease.

For example, a memory bandwidth control apparatus as described in Japanese Patent Application Laid-open No. 2005-84907 is known as a technique for improving the data transfer efficiency between an external device and memory. In this memory bandwidth control apparatus, an I/O buffer is provided to dynamically allocate a memory bandwidth for only an external device requesting data transfer among multiple external devices connected via an input/output port, and this can reduce useless consumption of the memory bandwidths as compared with a case where memory bandwidths are fixedly allocated to the multiple external devices, whereby the data transfer efficiency between the external devices and the memory is enhanced.

However, the technique described in Japanese Patent Application Laid-open No. 2005-84907 is a technique for improving the data transfer efficiency by allocating a memory bandwidth for only an external device requesting data transfer among the multiple external devices. Therefore, when the technique described in Japanese Patent Application Laid-open No. 2005-84907 is applied to the above image forming system, it is impossible to perform, in parallel, the processing for transferring the raster image data from the DFE apparatus to the image forming apparatus and writing the raster image data to the DDR and the processing for printing an image based on the raster image data read from the DDR, and this reduces the performance as the image forming system. When the transfer of the raster image data from the DFE apparatus to the image forming apparatus and the printing of the image based on the raster image data read from the DDR are performed in parallel, switching frequently occurs between writing and reading of data having different row addresses specified for the DDR even if the technique described in Japanese Patent Application Laid-open No. 2005-84907 is applied, and therefore, the data transfer efficiency is considered to decrease.

SUMMARY OF THE INVENTION

It is an object of the present invention to at least partially solve the problems in the conventional technology.

According to an aspect of the present invention, there is provided a memory control apparatus that controls writing and reading of data to/from a memory, the memory control apparatus including: a sequence control unit that receives a packet sequence including a write packet including a write request of data and a read packet including a read request of the data, and changes an arrangement of the write packet and the read packet included in the packet sequence so that a first predetermined number of write packets are arranged successively and a second predetermined number of read packets are arranged successively; and a command output unit that receives the packet sequence from the sequence control unit, and outputs a write command according to the write packet and an a read command according to the read packet to the memory, in accordance with an order of arrangement of the write packet and the read packet.

According to another aspect of the present invention, there is provided an information processing apparatus including: a memory; a memory control unit that controls writing and reading of data to/from the memory; and a processing unit that executes predetermined processing, based on the data that is read out from the memory, wherein the memory control unit includes: a sequence control unit that receives a packet sequence including a write packet including a write request of data and a read packet including a read request of the data, and changes an arrangement of the write packet and the read packet included in the packet sequence so that a first predetermined number of write packets are arranged successively and a second predetermined number of read packets are arranged successively; and a command output unit that receives the packet sequence from the sequence control unit, and outputs a write command according to the write packet and an a read command according to the read packet to the memory, in accordance with an order of arrangement of the write packet and the read packet.

According to still another aspect of the present invention, there is provided a memory control method performed by a memory control apparatus that controls writing and reading of data to/from a memory, the memory control method including: receiving a packet sequence including a write packet including a write request of data and a read packet including a read request of the data; changing an arrangement of the write packet and the read packet included in the packet sequence so that a first predetermined number of write packets are arranged successively and a second predetermined number of read packets are arranged successively; receiving the packet sequence, of which arrangement of the write packet and the read packet has been changed; and outputting a write command according to the write packet an a read command according to the read packet to the memory, in accordance with an order of arrangement of the write packet and the read packet.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 11 is a block diagram illustrating an example of functional configuration of the memory controller;

DETAILED DESCRIPTION OF THE PREFERRED EMBODIMENTS

An embodiment of a memory control apparatus, an information processing apparatus, and a memory control method according to this invention will be hereinafter explained in detail with reference to attached drawings. In the description below, for example, an image forming system including a DFE apparatus and an image forming apparatus connected via a communication cable will be explained. In embodiments described below, the image forming apparatus corresponds to an "information processing apparatus" described in the claims, and a memory controller provided in the image forming apparatus corresponds to a "memory control apparatus" described in the claims. It should be noted that the apparatus (system) to which the present invention can be applied is not limited to the above.

First Embodiment

Figure 1:
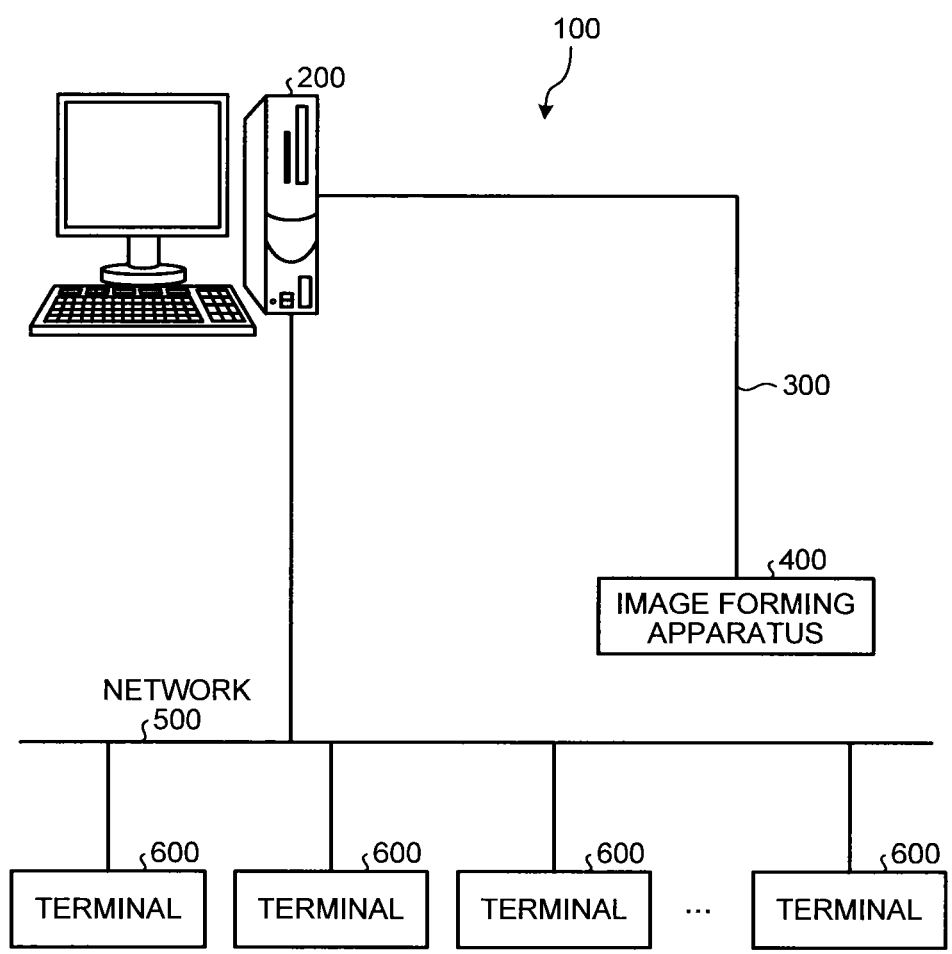
FIG. 1 is a schematic configuration diagram illustrating an image forming system according to an embodiment.

FIG. 1 is a schematic configuration diagram illustrating an image forming system 100 according to the present embodiment. The image forming system 100 includes a DFE apparatus 200 and an image forming apparatus 400. The DFE apparatus 200 and the image forming apparatus 400 are connected via a communication cable 300. The DFE apparatus 200 functions as a so-called print server. The DFE apparatus 200 is also connected to multiple terminals (client terminals) 600 such as PCs used by users via a network 500.

Figure 2:
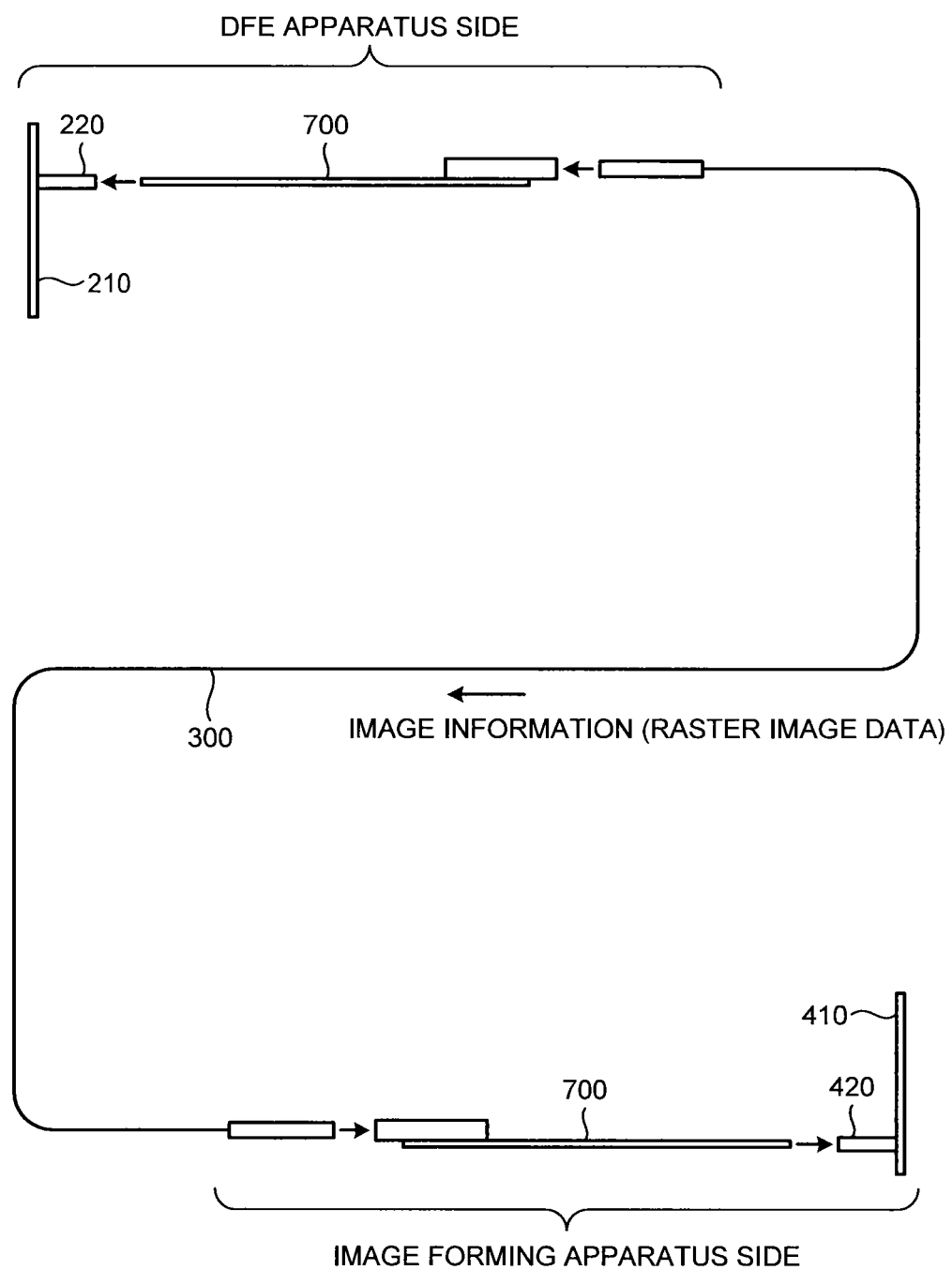
FIG. 2 is a figure explaining a transmission path between a DFE apparatus and an image forming apparatus.

As illustrated in FIG. 2, a slot based on PCIe standard (hereinafter referred to as "PCIe slot") 220 is provided on a motherboard 210 of the DFE apparatus 200. A card adapter 700 is attached to the PCIe slot 220.

As illustrated in FIG. 2, a PCIe slot 420 is provided on a motherboard 410 of the image forming apparatus 400. A card adapter 700 is attached to the PCIe slot 420.

The card adapter 700 in the DFE apparatus 200 and the card adapter 700 in the image forming apparatus 400 are connected to each other via the communication cable 300. Accordingly, the DFE apparatus 200 and the image forming apparatus 400 are connected so that the DFE apparatus 200 and the image forming apparatus 400 can communicate with each other by way of the card adapters 700 of them both and via the communication cable 300, and high-speed information communication is performed between the DFE apparatus 200 and the image forming apparatus 400.

In the image forming system 100 according to the present embodiment, image information (image information about black, image information about cyan, image information about magenta, and image information about yellow) is transferred from the DFE apparatus 200 to the image forming apparatus 400 in the format of the raster image data. The image forming apparatus 400 forms a color image based on the raster image data transferred from the DFE apparatus 200.

It should be noted that various communication cables such as a copper cable, an optical active cable, and other cables capable of transmitting high-speed differential signals based on the PCIe standard can be used as the communication cable 300.

Figure 3:
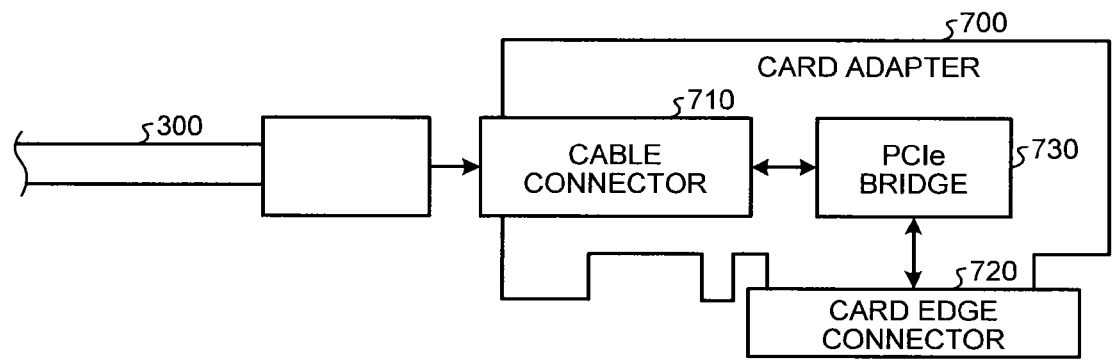
FIG. 3 is a schematic diagram illustrating an overview of a card adapter.

FIG. 3 is a schematic diagram illustrating an overview of the card adapter 700. The card adapter 700 is configured the same in the DFE apparatus 200 and in the image forming apparatus 400. As illustrated in FIG. 3, the card adapter 700 includes a cable connector 710, a card edge connector 720, and a PCIe bridge 730.

The cable connector 710 is a connector to which the communication cable 300 is attached. The card edge connector 720 is a connector connected to a terminal of the PCIe slot 220 or the PCIe slot 420 when the card adapter 700 is attached to the PCIe slot 220 or the PCIe slot 420. Those based on the PCIe standard are used as the cable connector 710 and the card edge connector 720.

The PCIe bridge 730 is a bridge based on the PCIe standard, for relaying data between the cable connector 710 and the card edge connector 720. A non-transparent bridge is used as the PCIe bridge 730. When the DFE apparatus 200 and the image forming apparatus 400 are connected using the non-transparent PCIe bridge 730, the DFE apparatus 200 and the image forming apparatus 400 can separately perform initialization process without being hindered. In addition, the processor of each apparatus can access the resources of each other while operating separately.

The PCIe bridge 730 is preferably a bridge having a clock isolation function. The clock isolation function is a function for dividing a clock domain with the bridge being a border. With the clock isolation function, a region between the PCIe bridge 730 in the DFE apparatus 200 and the PCIe bridge 730 in the image forming apparatus 400 (region used to transfer the raster image data using the communication cable 300) can be made into a clock domain independent from the other regions. In the clock domain between the PCIe bridge 730 in the DFE apparatus 200 and the PCIe bridge 730 in the image forming apparatus 400, non-spread spectrum clock is used as the clock. In the clock domains other than the clock domain between the PCIe bridge 730 in the DFE apparatus 200 and the PCIe bridge 730 in the image forming apparatus 400, spread spectrum clock is used as the clock. This allows appropriate communication between the DFE apparatus 200 and the image forming apparatus 400 with synchronization maintained therebetween while reducing electromagnetic interference (EMI).

In other words, in order to reduce the EMI, it is effective to use the spread spectrum clock as the clock being the reference of operations of the DFE apparatus 200 and the image forming apparatus 400. However, when the spread spectrum clock is used as the clock for the entire image forming system 100, synchronization cannot be maintained between the DFE apparatus 200 and the image forming apparatus 400, and it is impossible to appropriately communicate using the communication cable 300. In contrast, when the clock isolation function of the PCIe bridge 730 is used to separate the clock domain between the PCIe bridges 730, and non-spread spectrum clock is used as the clock only in this portion, the DFE apparatus 200 and the image forming apparatus 400 can appropriately communicate using the communication cable 300 while reducing the EMI caused by the entire image forming system 100.

Subsequently, specific example of configuration of the DFE apparatus 200 and the image forming apparatus 400 in the image forming system 100 according to the present embodiment will be further explained in detail.

Figure 4:
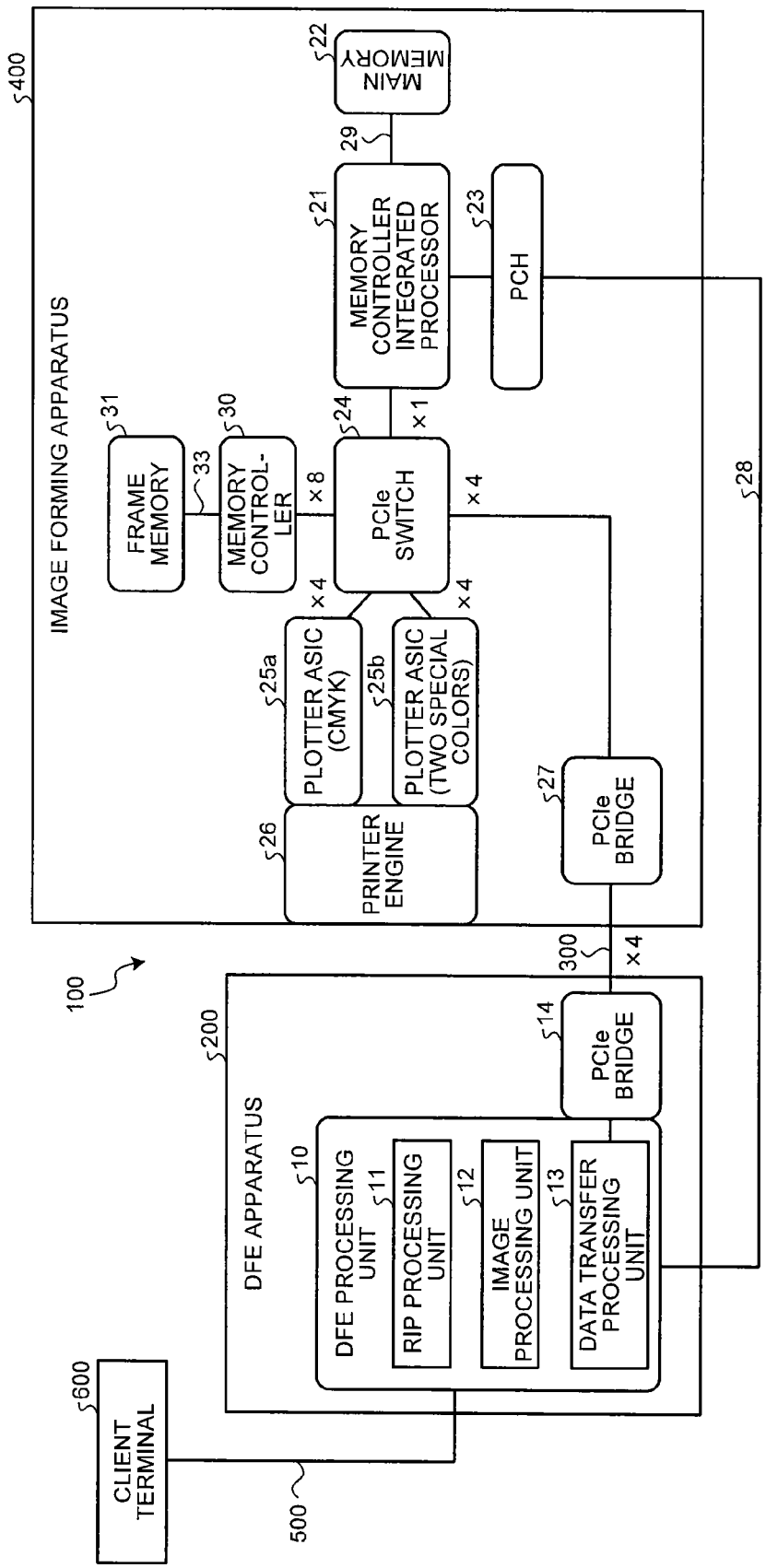
FIG. 4 is a figure illustrating a specific example of configuration of the DFE apparatus and the image forming apparatus.

FIG. 4 is a figure illustrating specific example of configuration of the DFE apparatus 200 and the image forming apparatus 400 in the image forming system 100 according to the present embodiment. In the image forming system 100 according to the present embodiment, the DFE apparatus 200 and the image forming apparatus 400 are connected via the communication cable 300 based on the PCIe standard. In addition, the DFE apparatus 200 is connected to the client terminal 600 such as a PC used by a user via the network 500 such as a LAN.

The DFE apparatus 200 includes a DFE processing unit 10. The DFE processing unit 10 is a data processing unit, provided in the DFE apparatus 200, that is achieved with a processor and memory, not shown. The DFE processing unit 10 includes, as principle functional elements, an RIP processing unit 11, an image processing unit 12, and a data transfer processing unit 13.

The RIP processing unit 11 receives a print job sent via the network 500 from the client terminal 600, and expands data in a PDL format included in the print job to a raster image data for printing.

The image processing unit 12 performs image processing for image editing, such as rotation, enlargement, reduction of images, on the raster image data generated by the RIP processing unit 11. The raster image data processed by the image processing unit 12 are stored to the memory, not shown.

The data transfer processing unit 13 retrieves the raster image data, which has been processed by the image processing unit 12, in units of pages from the memory. Then, the data transfer processing unit 13 transfers the raster image data, which have been retrieved from the memory, to the image forming apparatus 400 via the communication cable 300 by means of memory write transfer. The memory write transfer is processing for transferring data in response to a write request (in this embodiment, this write request is a request for writing raster image data to a frame memory 31 of the image forming apparatus 400, explained later. Hereinafter, this write request will be referred to as "write request".).

A card adapter, not shown, (corresponding to the card adapter 700 explained above) is used for connection with the communication cable 300. A PCIe bridge 14 (corresponding to the PCIe bridge 730 explained above), to which the raster image data transferred to the image forming apparatus 400 via the communication cable 300 is input, is implemented on the card adapter. By way of this PCIe bridge 14, the raster image data are transferred to the image forming apparatus 400 via the communication cable 300 according to the protocol of PCIe.

The number of lanes of the PCIe used for the transfer of the raster image data is the number of lanes with which sufficient transfer bandwidth can be obtained according to the required print processing speed and the size of the raster image data transferred. In this case, for example, the raster image is transferred with 4 lanes (×4). In the image forming system 100 according to the present embodiment, the raster image data are transferred in uncompressed state from the DFE apparatus 200 to the image forming apparatus 400.

The image forming apparatus 400 includes a memory controller integrated processor 21, a main memory 22, a PCH 23, a PCIe switch 24, two plotter ASICs 25a, 25b, a printer engine 26, a frame memory 31, and a memory controller 30 (corresponding to "memory control apparatus" described in the claims).

In the image forming apparatus 400, a card adapter, not shown, (corresponding to the card adapter 700 explained above) is provided for connection with the communication cable 300. By way of a PCIe bridge 27 (corresponding to the PCIe bridge 730 explained above) implemented on this card adapter, the raster image data transferred from the DFE apparatus 200 via the communication cable 300 according to the protocol of PCIe are input.

In the image forming system 100 according to the present embodiment, the non-transparent bridges are used for both of the PCIe bridge 14 in the DFE apparatus 200 and the PCIe bridge 27 in the image forming apparatus 400 explained above. In other words, in the image forming system 100 according to the present embodiment, the non-transparent bridges are connected with each other via the communication cable 300, so that inter-host communication is enabled between the DFE apparatus 200 and the image forming apparatus 400.

In this case, the PCIe bridge 27 in the image forming apparatus 400 is non-transparent when it is seen from the DFE apparatus 200, and the PCIe bridge 14 in the DFE apparatus 200 is non-transparent when it is seen from the image forming apparatus 400. Therefore, when the image forming system 100 is started, the image forming system 100 operates normally no matter whether it is activated from the DFE apparatus 200 or the image forming apparatus 400, and the order of activation at the start-up is not limited. The system would not freeze even if the communication cable 300 is disconnected during operation after the system start-up. Furthermore, when the DFE apparatus 200 and the image forming apparatus 400 communicate with each other, it is necessary to exchange addresses between the DFE apparatus 200 and the image forming apparatus 400, and an address space (NT space) common to the non-transparent bridges (PCIe bridges 14, 27) can be provided in addition to the address space of the DFE apparatus 200 and the address space of the image forming apparatus 400. Moreover, the NT space can be fixed. Therefore, both of the DFE apparatus 200 and the image forming apparatus 400 may translate addresses from/to the NT space, and this makes address translation easy.

In addition, in the image forming system 100 according to the present embodiment, the bridges having the clock isolation function are used for both of the PCIe bridge 14 in the DFE apparatus 200 and the PCIe bridge 27 in the image forming apparatus 400, and the clock domain between the PCIe bridge 14 and the PCIe bridge 27 is made into the independent clock domain. The spread spectrum clock is used as the clock in the clock domains other than the one between the PCIe bridge 14 and the PCIe bridge 27, and the non-spread spectrum clock is used as the clock in the clock domain between the PCIe bridge 14 and the PCIe bridge 27. Therefore, appropriate communication can be performed between the DFE apparatus 200 and the image forming apparatus 400 with synchronization maintained therebetween while reducing electromagnetic interference (EMI).

The memory controller integrated processor 21 executes, e.g., transfer control processing for controlling the transfer of the raster image data from the DFE apparatus 200. The memory controller integrated processor 21 uses the main memory 22 as a work area for executing various kinds of processing (software) including this transfer control processing. In the image forming system 100 according to the present embodiment, the raster image data are transferred in uncompressed state from the DFE apparatus 200 to the image forming apparatus 400. The image processing for image editing of the raster image data is performed by the DFE apparatus 200. Therefore, the memory controller integrated processor 21 does not perform the image processing for extension processing and image editing of the raster image data.

The memory controller integrated processor 21 is connected to the DFE processing unit 10 of the DFE apparatus 200 via a PCH 23 and a control signal transmission cable 28 connected thereto. The transfer of the raster image data from the DFE apparatus 200 to the image forming apparatus 400 is executed according to a control signal transmitted by way of the control signal transmission cable 28 from the memory controller integrated processor 21 to the DFE processing unit 10, so that transfer start timing and the like of the raster image data is controlled in units of pages.

The main memory 22 is connected to the memory controller integrated processor 21 via a first memory bus 29. This main memory 22 is used as a work area of the memory controller integrated processor 21. In the image forming system 100 according to the present embodiment, the raster image data transferred from the DFE apparatus 200 are not stored to the main memory 22, and are stored to the frame memory 31 connected to the memory controller 30.

The PCIe switch 24 is connected to the PCIe bridge 27, the memory controller 30, the plotter ASIC 25a, the plotter ASIC 25b, and the memory controller integrated processor 21. The PCIe switch 24 performs packet routing between the PCIe bridge 27, the memory controller 30, the plotter ASIC 25a, the plotter ASIC 25b, and the memory controller integrated processor 21.

In the image forming system 100 according to the present embodiment, the number of connection lanes between the memory controller integrated processor 21 and the PCIe switch 24 is one-lane connection (×1) which is the minimum. This is because, in the image forming system 100 according to the present embodiment, the raster image data are not transferred between the memory controller integrated processor 21 and the PCIe switch 24, and transferred therebetween are no more than register setting packets, with which the memory controller integrated processor 21 sets, in the plotter ASICs 25a, 25b, the size of one line and an address of descriptor.

The plotter ASICs 25a, 25b performs memory read transfer to read the raster image data stored in the frame memory 31 from the main memory 22 line by line in the main scanning direction in synchronization with print speed (sheet feeding speed) of the printer engine 26, and transfers the raster image data to the printer engine 26. It should be noted that each of the plotter ASICs 25a, 25b is configured to be able to perform the memory read transfer processing for four colors. The plotter ASIC 25a supports four colors, i.e., CMYK, and the plotter ASIC 25b supports a clear toner and two special colors. The memory read transfer is processing for transferring data in response to a read request (in this embodiment, this read request is a request for reading raster image data from the frame memory 31 of the image forming apparatus 400, explained later. Hereinafter, this read request will be referred to as "read request".).

The printer engine 26 forms an image on paper, i.e., a recording medium, based on the raster image data transferred by the plotter ASICs 25a, 25b in a line cycle.

The frame memory 31 stores the raster image data, which are transferred from the DFE apparatus 200, in units of pages. For example, a DDR capable of achieving high data transfer speed is used as the frame memory 31. Alternatively, in addition to the DDR, various kinds of SDRAMs which write and read data in synchronization with the clock signal can be used as the frame memory 31. The frame memory 31 is connected to the memory controller 30 via a second memory bus 33.

The memory controller 30 controls writing and reading of the raster image data to/from the frame memory 31. The memory controller 30 is connected to the frame memory 31 via the second memory bus 33, and is also connected to the PCIe switch 24. For example, the memory controller 30 may use an ASIC having a PCIe connection port and a DDR memory bus (second memory bus 33), a general-purpose high-speed FPGA (Field Programmable Gate Array) having a high-speed IO supporting the PCIe and the DDR memory bus, and the like. It should be noted that the specific example of configuration of the memory controller 30 will be explained later in detail.

The number of connection lanes between the memory controller 30 and the PCIe switch 24 is the number of connection lanes with which a wider bandwidth can be ensured than the bandwidth required for the two plotter ASICs 25a, 25b. In the image forming system 100 according to the present embodiment, each of the plotter ASICs 25a, 25b is configured as the four-lane connection (×4), and therefore, the number of connection lanes between the memory controller 30 and the PCIe switch 24 is eight-lane connection (×8).

Figure 5:
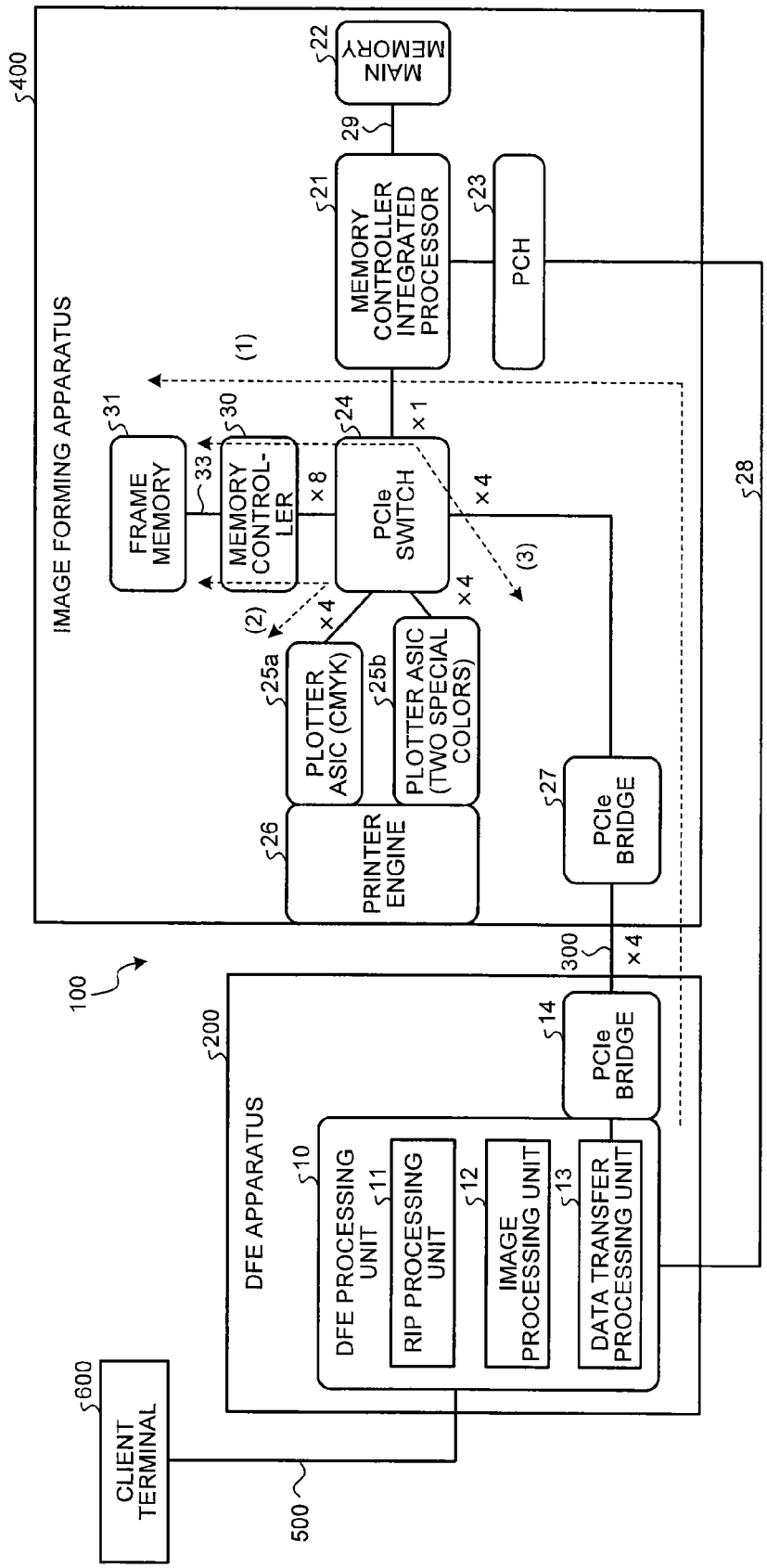
FIG. 5 is a figure illustrating a data flow of raster image data in an image forming apparatus having a configuration as illustrated in FIG. 4.

Subsequently, data flow of the raster image data in the image forming system 100 according to the present embodiment will be explained with reference to FIG. 5. FIG. 5 is a figure illustrating the data flow of the raster image data in the image forming apparatus 400 having the configuration as illustrated in FIG. 4.

The raster image data generated by the RIP processing unit 11 of the DFE apparatus 200 are processed by the image processing unit 12. Thereafter, with memory write transfer by the data transfer processing unit 13, the raster image data are transferred to the image forming apparatus 400 in units of pages by way of the PCIe bridge 14 and the communication cable 300 in uncompressed state. The raster image data transferred from the DFE apparatus 200 to the image forming apparatus 400 are input to the memory controller 30 by way of the PCIe bridge 27 and the PCIe switch 24, and are written to the frame memory 31 by the memory controller 30 (path as indicated by arrow (1) of broken-line in FIG. 5).

At this occasion, the PCIe switch 24 of the image forming apparatus 400 relays the transfer of the raster image data between the PCIe bridge 27 and the memory controller 30. The memory controller 30 stores the raster image data, which have been transferred from the DFE apparatus 200 by way of the communication cable 300, the PCIe bridge 27, and the PCIe switch 24, to the frame memory 31 via the second memory bus 33.

When the raster image data for one page are stored to the frame memory 31, the plotter ASICs 25a, 25b of the image forming apparatus 400 transmit the read request to the memory controller 30. Thereafter, with the memory read transfer, the plotter ASICs 25a, 25b read the raster image data stored in the frame memory 31 for the pages from the frame memory 31 line by line in synchronization with the print speed (sheet feeding speed) of the printer engine 26, and transfers the raster image data to the printer engine 26 (paths indicated by arrow (2) of broken line and arrow (3) of broken line in FIG. 5). At this occasion, the PCIe switch 24 relays the transfer of the raster image data between the memory controller 30 and the plotter ASICs 25a, 25b. The plotter ASICs 25a, 25b obtains the raster image data, which have been read from the frame memory 31 via the memory controller 30, by way of the PCIe switch 24, and provides the raster image data to the printer engine 26.

While each line of raster image data is provided from the frame memory 31 to the printer engine 26 with the memory read transfer by the plotter ASICs 25a, 25b, raster image data for a subsequent page are transferred to the image forming apparatus 400 and written to the frame memory 31 with the memory write transfer by the data transfer processing unit 13 of the DFE apparatus 200. In other words, the image forming system 100 according to the present embodiment processes, in parallel at a time, the processing for writing the raster image data to the frame memory 31 in units of pages and the processing for reading the raster image data from the frame memory 31 in units of lines and providing the raster image data to the printer engine 26, thus executing print processing.

As described above, the image forming system 100 according to the present embodiment processes, in parallel at a time, the processing for writing the raster image data to the frame memory 31 in units of pages and the processing for reading the raster image data from the frame memory 31 in units of lines and providing the raster image data to the printer engine 26. Therefore, a packet sequence in which a write packet including a write request and a read packet including a read request exist in a mixed manner is sent from the PCIe switch 24 to the memory controller 30. The memory controller 30 has a function of writing and reading the raster image data to/from the frame memory 31 at a high speed by changing the arrangement of the write packets and the read packets included in this packet sequence.

Figure 6:
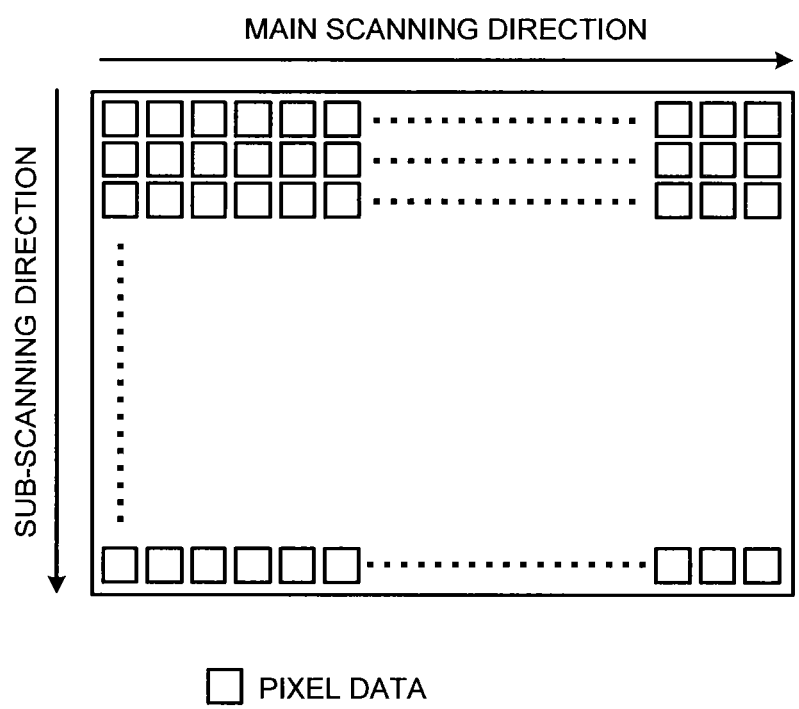
FIG. 6 is a figure explaining a configuration of raster image data.

FIG. 6 is a figure illustrating the configuration of the raster image data. As illustrated in FIG. 6, the raster image data are constituted by two-dimensional array in the main scanning direction and the sub-scanning direction. In the image forming system 100 according to the present embodiment explained above, the RIP processing unit 11 of the DFE apparatus 200 generates the raster image data as illustrated in FIG. 6, and the raster image data are transferred to the frame memory 31 of the image forming apparatus 400.

The data transfer from the frame memory 31 to the printer engine 26 with the plotter ASICs 25a, 25b is executed by synchronized transfer in which processing of transferring pixel data in the main scanning direction with a determined time cycle is repeated in the sub-scanning direction.

Figure 7:
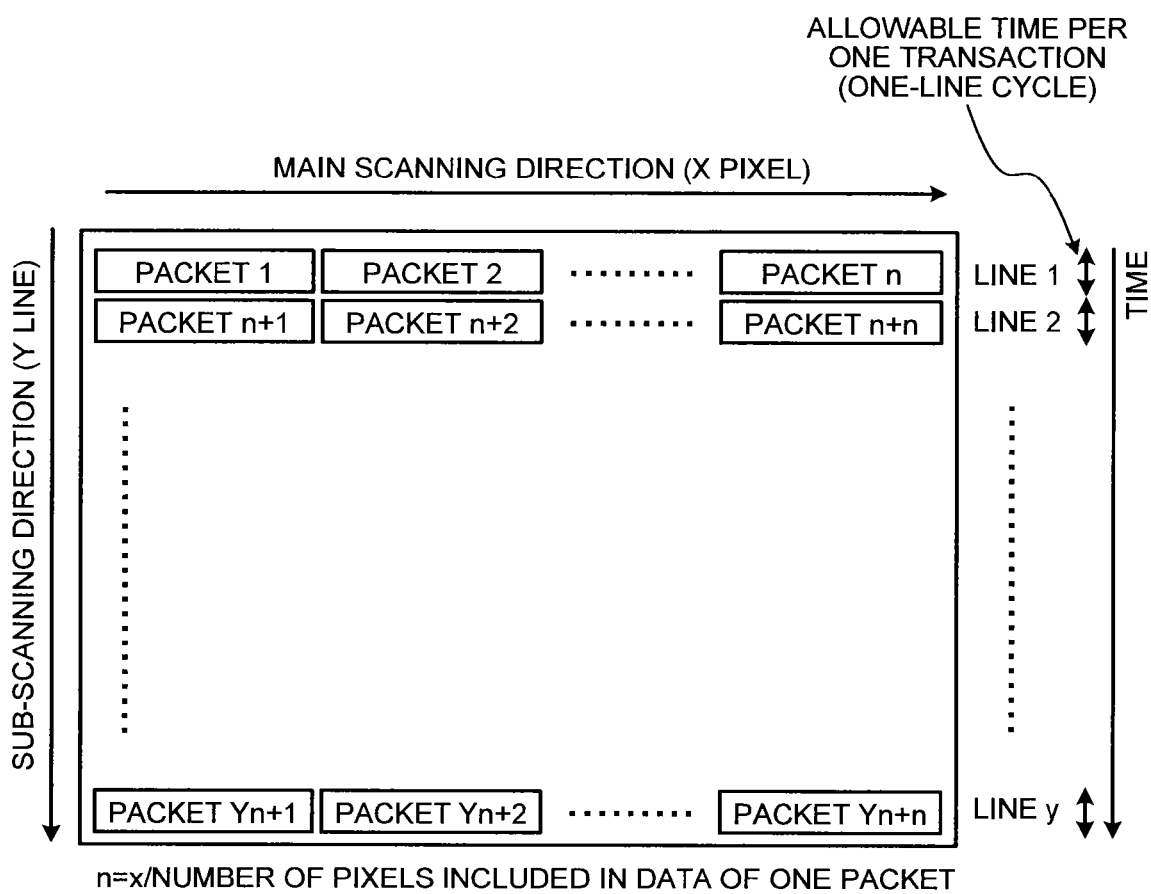
FIG. 7 is an explanatory diagram illustrating transaction in data transfer of the image forming apparatus.

FIG. 7 is an explanatory diagram illustrating a transaction in the memory read transfer of the image forming apparatus 400. As illustrated in FIG. 7, in the memory read transfer of the image forming apparatus 400, for each line in the main scanning direction, multiple pixel data are treated as a piece of packet data, and it is necessary to transfer the packet data in synchronization with the speed in which the image is scanned in the sub-scanning direction as a transaction constituted by multiple packet groups (in the example of FIG. 7, n packet groups) for each line. An allowable time per transaction is referred to as one-line cycle. As explained blow, the one-line cycle is determined by a print image resolution and a sheet feeding speed of the printer engine 26.

One-line cycle (s)=1/{[sheet feeding speed (mm/s)]×[the number of pixels per 1 mm]}

When the image forming apparatus 400 includes a scanner engine, it is necessary to transfer pixel data read by the scanner engine to the frame memory 31 using similar synchronized transfer. In this case, as explained below, the one-line cycle is determined by a reading resolution and a head moving speed provided on the scanner engine.

one-line cycle (s)=1/{[head moving speed (mm/s)]×[the number of pixels per 1 mm]}

Figure 8:
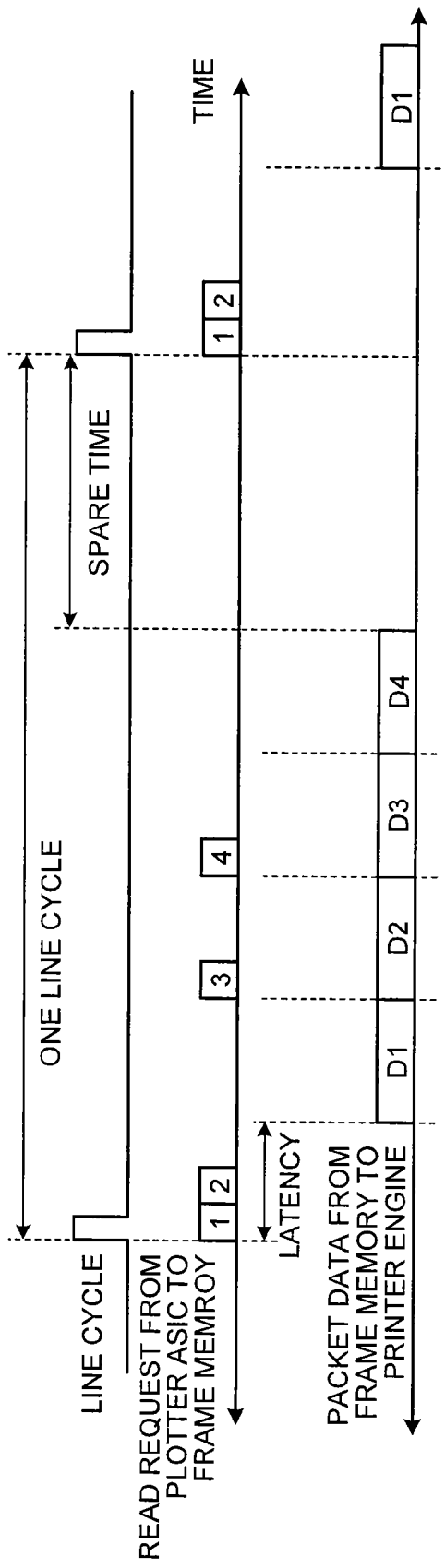
FIG. 8 is a timing chart illustrating an example of data transfer synchronized with one-line cycle of the image forming apparatus.

FIG. 8 is a timing chart illustrating an example of data transfer in synchronization with one-line cycle of the image forming apparatus 400. In the explanation below, for the sake of simplifying the explanation, it is assumed that the amount of data for one line can be transferred with four packets.

The memory read transfer from the frame memory 31 to the printer engine 26 with the plotter ASICs 25a, 25b is a synchronized transfer in synchronization with the one-line cycle as described above. This memory read transfer is executed in response to a read request from the plotter ASICs 25a, 25b to the frame memory 31 (packet read request).

When all the packet data for one line of the raster image data (in the figure, D1 to D4) are transferred from the frame memory 31 to the printer engine 26 within the one-line cycle, line synchronization constraints are complied with. In the example of FIG. 8, the transfer of the packet data D1 to D4 is completed within the one-line cycle, and this means that the line synchronization constraints are complied with. A time from when the transfer of the packet data D1 to D4 is completed to when a subsequent line cycle is started is a spare time.

In the example of FIG. 8, a response delay time (latency) of the frame memory in response to a read request given by the plotter ASICs 25a, 25b is short, and therefore, the data transfer can be performed while complying with the line synchronization constraints. However, when the response delay time is long, the transfer of all the packet data (in the figure, D1 to D4) for one line of the raster image data cannot be completed within one-line cycle, and therefore, an error occurs in the printer engine 26, and an abnormal image is printed on paper.

The above line synchronization constraints are unique to the data transfer of the image forming apparatus 400 forming an image with the printer engine 26 on a sheet of paper moving at a high speed, and for example, as illustrated by arrow (1) of broken line of FIG. 5, when the raster image data are transferred in units of pages from the DFE apparatus 200 to the image forming apparatus 400, the above constraints do not exist. In other words, when the data transfer in units of pages is delayed, the number of sheets printed in a time decreases, but the printer engine 26 temporarily stops between sheets to be printed, so that the printer engine 26 can wait for completion of the data transfer in units of pages, and this does not cause occurrence of error or printing of abnormal image. In contrast, high-speed movement of sheets cannot be stopped quickly when the data transfer in units of lines is delayed, and therefore, the line synchronization constraint should always be complied with.

In particular, in an image forming system requiring high-speed and high-resolution print processing for large-volume printing businesses and the like, the one-line cycle is extremely short, e.g., in the order of several dozen microseconds, and it is necessary to transfer the amount of data for one line, which is as much as several kilo bytes, in this short period. Accordingly, a countermeasure is required, so that the line synchronization constraints can be reliably complied with even in such circumstances.

As described above, the image forming system 100 according to the present embodiment is a system that processes, in parallel at a time, the processing for writing the raster image data to the frame memory 31 in units of pages and the processing for reading the raster image data from the frame memory 31 in units of lines and providing the raster image data to the printer engine 26. Therefore, writing and reading of the raster image data to the frame memory 31 are alternately performed in a time-divisional manner, and in order to reliably comply with the line synchronization constraints, it is necessary to appropriately control the access to the frame memory 31. Further, in order to prevent temporary stop of the printer engine 26 explained above and improve the performance as the system, it is necessary to not only reliably comply with the line synchronization constraints but also efficiently transfer the raster image data in units of pages from the DFE apparatus 200 to the image forming apparatus 400.

Accordingly, in the image forming system 100 according to the present embodiment, the memory controller 30 controlling writing and reading of the raster image data to/from the frame memory 31 has a function of changing the order in which the write packets and read packets included in the input packet sequence are arranged, so as to allow high speed writing and reading of the raster image data to/from the frame memory 31.

In the image forming system 100 according to the present embodiment, the above DDR is used as the frame memory 31 of the image forming apparatus 400. Therefore, when the same row address is accessed successively during writing and reading of the raster image data to/from the frame memory 31, the data can be written and read at a high speed. On the other hand, when the row address is frequently switched, and in particular, writing and reading of data are alternately performed by specifying different row addresses, it takes time to wait for completion of command reception every time writing and reading are switched, and this reduces the performance.

This will be explained in more detail. The data reading from the DDR is operation such that the electrical charge in a memory cell specified by a column address in a line specified by a row address is output as data. At this occasion, it is necessary to charge the electrical charge in the memory cell and output the electrical charge, and the charging of the electrical charge is performed at a time for all the memory cells of the same row address. Therefore, when the data are successively read from the same row address, the electrical charge is charged at first, and if the electrical charge is charged at first, it is not necessary to charge the electrical charge every time data are read from the memory cell thereafter. However, when writing of data to a memory cell of a different row address is interposed between reading of data, it is necessary to charge the electrical charge again when data are read again after data are written. The time until the end of charging of the electrical charge at this data reading process is the time for waiting for completion of command reception. When the data are written, it is not necessary to charge the electrical charge, and therefore, such time does not occur.

As described above, the image forming system 100 according to the present embodiment performs, at a time, the processing for transferring the raster image data from the DFE apparatus 200 to the image forming apparatus 400 and writing the raster image data to the frame memory 31 and the printing of the image based on the raster image data read from the frame memory 31. Therefore, writing and reading of the raster image data to/from the frame memory 31 is alternately performed in a time division manner, and switching frequently occurs between writing and reading of data specifying different row addresses.

In other words, the raster image data are read from the frame memory 31 for each line, and this is data reading process from the same row address. Therefore, when the raster image data for one line can be read successively from the frame memory 31, a time is needed to charge the electrical charge when the first data of the line are read, but data reading process subsequent thereto can be performed at a high speed. However, in the image forming system 100 according to the present embodiment, while the raster image data for one line are read from the frame memory 31, it is necessary to write the raster image data, which have been transferred from the DFE apparatus 200 to the image forming apparatus 400, to the frame memory 31. At this occasion, the destination to which the raster image data are written is the memory cell from which the raster image data have already been read out. Therefore, writing process is performed on a memory cell of a row address different from that of the memory cell from which the raster image data are being read. For example, when data are written and read alternately packet by packet, it takes time to wait for completion of command reception every time switching from writing to reading is performed, and this reduces the data transfer efficiency.

Figure 9:
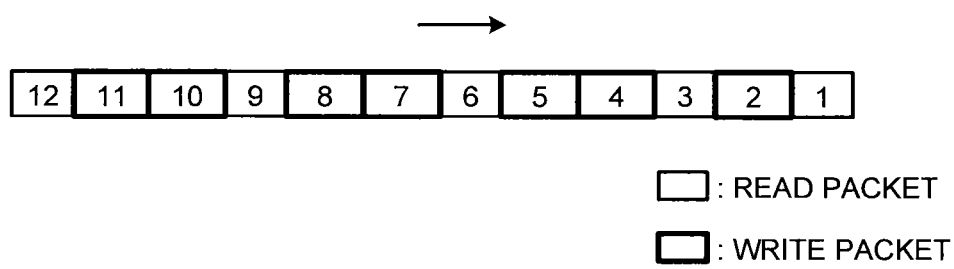
FIG. 9 is a conceptual diagram illustrating an example of a packet sequence which is input to a memory controller.

FIG. 9 is a conceptual diagram illustrating an example of a packet sequence that is input to the memory controller 30. In FIG. 9, among the packets included in the packet sequence, a read packet is denoted as a thin-line rectangle, and a write packet is denoted as a thick-line rectangle. The read packet is a packet including a read request. The write packet is a packet including a write request. In the explanation about the present embodiment, the write packet is assumed to include not only the write request but also the raster image data written to the frame memory 31 (hereinafter, the raster image data will be simply abbreviated as "data"). Therefore, the timed required to process the write packet is longer than the time required to process the read packet. For example, the read packet requires a processing time of 6 cycles per one packet (1 cycle is a time from rising edge of the synchronization signal to a subsequent rising edge of the synchronization signal), whereas the write packet requires a processing time of 10 cycles per one packet. It should be noted that the packet sequence flows in a direction indicated by an arrow in the figure, and a number attached to each packet represents the ordinal level in which the packet is input to the memory controller 30.

Figure 10:
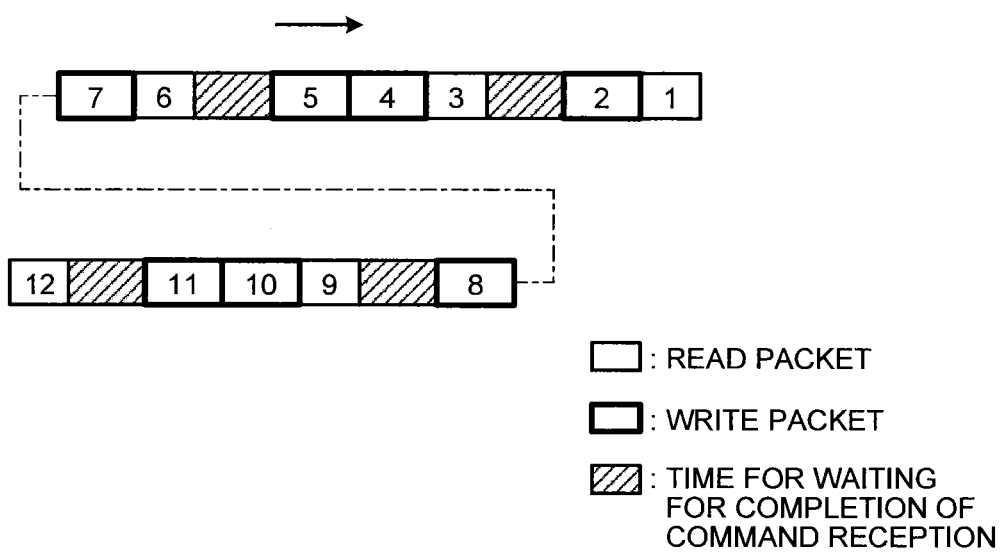
FIG. 10 is a conceptual diagram illustrating processing time when the packet sequence as illustrated in FIG. 9 is processed as it is and data are written and read to/from a frame memory.

FIG. 10 is a conceptual diagram illustrating the processing time when writing and reading of data to/from the frame memory 31 is performed by processing the packet sequence as illustrated in FIG. 9 as it is. A region with a hatching in the figure represents a time for waiting for completion of command reception (for example, 10 cycles).

As illustrated in FIG. 10, when the packet sequence that is input to the frame memory 31 includes the write packet and the read packet existing in a mixed manner, it takes time to wait for completion of command reception from when the write packet is processed to when the read packet is processed. This is because, as described above, the row address specified by the write request included in the write packet and the row address specified by the read request included in the read packet are different, and it takes time to charge the electrical charge when data are read from the memory cell in response to the read request. When it often takes time to wait for completion of command reception between the write packet and the read packet, the data transfer efficiency is reduced, which makes it difficult to comply with the above line synchronization constraints and maintain successive printing of multiple pages with the printer engine 26.

FIG. 11 is a block diagram illustrating an example of functional configuration of the memory controller 30 provided in the image forming apparatus 400 according to the present embodiment. As illustrated in FIG. 11, the memory controller 30 includes a sequence control unit 310 and a memory control unit 320.

The sequence control unit 310 changes the order of the write packets and the read packets included in the packet sequence that is input to the memory controller 30, so that a first predetermined number of write packets are arranged successively, and a second predetermined number of read packets are arranged successively. The sequence control unit 310 includes a write buffer 311, a read buffer 312, and a buffer control unit 313.

The write buffer 311 accumulates the first predetermined number, defined in advance, of write packets included in the packet sequence that is input to the memory controller 30, and successively outputs the first predetermined number of write packets accumulated. The read buffer 312 accumulates the second predetermined number, defined in advance, of read packets included in the packet sequence that is input to the memory controller 30, and successively outputs the second predetermined number of read packets accumulated.

The buffer control unit 313 controls the output of the write packets from the write buffer 311 and the output of the read packets from the read buffer 312. More specifically, when the write buffer 311 does not successively output the first predetermined number of write packets, the buffer control unit 313 causes the second predetermined number of read packets to be successively output from the read buffer 312, and when the read buffer 312 does not successively output the second predetermined number of read packets, the buffer control unit 313 causes the first predetermined number of read packets to be successively output from the write buffer 311.

The number of accumulated write packets in the write buffer 311 (the first predetermined number) and the number of accumulated read packets in the read buffer 312 (second predetermined number) are set to the numbers satisfying the following two conditions at the same time.

Condition 1: the reading time of data for one line in the horizontal direction of the image from the frame memory 31 is equal to or less than a target time defined in advance in order to comply with the line synchronization constraints (hereinafter referred to as "line read target time").

Condition 2: the writing time of data for one page of the image to the frame memory 31 is equal to or less than a target time defined in advance in order to allow successive printing of multiple pages without temporarily stopping the printer engine 26 between pages (hereinafter referred to as "page write target time").

It should be noted that specific examples of the first predetermined number and the second predetermined number that satisfy not only the condition 1 but also the condition 2 will be explained later in detail.

In the packet sequence that is input to the memory controller 30, packets are sorted by the processing of the sequence control unit 310. Then, the packet sequence that is output from the sequence control unit 310 is made into a packet sequence in which the first predetermined number of write packets are arranged successively and the second predetermined number of read packets are arranged successively. For the sake of convenience, FIG. 11 illustrates an example where packets included in the packet sequence are sorted so that two write packets and two read packets are arranged successively. The packet sequence of which packets are sorted by the sequence control unit 310 is input to the memory control unit 320.

The memory control unit 320 includes a command generating unit 321 (corresponding to "command output unit" described in the claims) and a data control unit 322.

The command generating unit 321 receives the packet sequence in which the packets are sorted by the sequence control unit 310, and respectively generates write commands according to the write packets and read commands according to the read packets in accordance with the order of the write packets and the read packets in the received packet sequence, and outputs the write commands and the read commands to the frame memory 31. More specifically, the command generating unit 321 looks up a request included in a packet (the write request or the read request) in such an order that the packet at the head of the received packet sequence is looked up first, and generates commands such as RAS (Row Array Strobe) and CAS (Column Array Strobe) given to the frame memory 31 (when the access direction information is write, a write command is generated, when the access direction information is read, a read command is generated), based on access information included in the request (address of a memory cell to be accessed) and access direction information (write/read). Then, the command generating unit 321 outputs the generated command to the frame memory 31.

The data control unit 322 controls writing and reading of data to/from the frame memory 31. More specifically, in the memory write transfer, the data control unit 322 retrieves data to be written from the write packet that is input to the memory control unit 320, and outputs the data to the frame memory 31. In the memory read transfer, the data control unit 322 retrieves data read from the frame memory 31, and outputs the data to the PCIe switch 24.

Figure 12A:
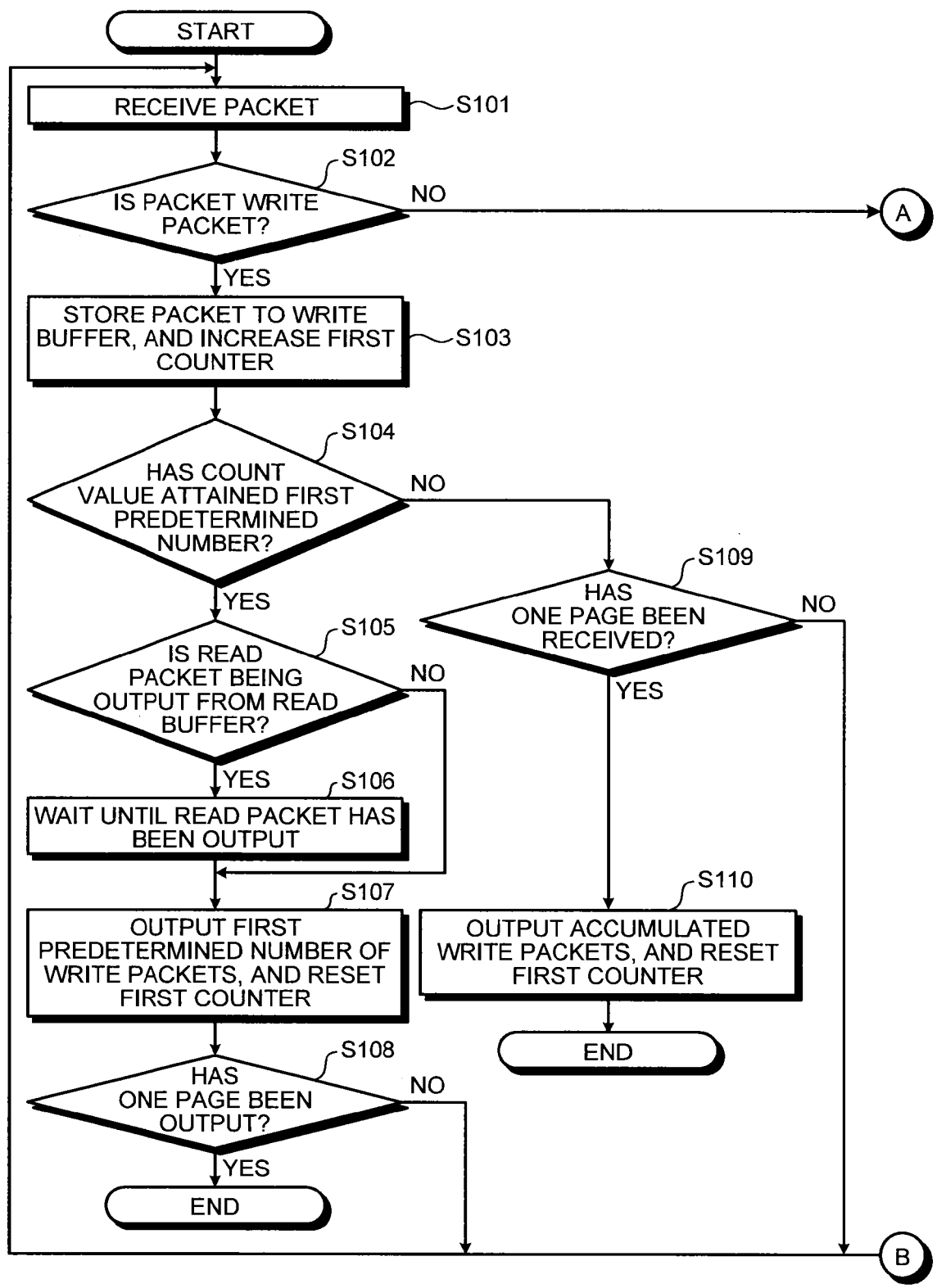
FIGS. 12A and 12B are flowcharts illustrating flow of processing performed by a sequence control unit provided in the memory controller.
Figure 12B:
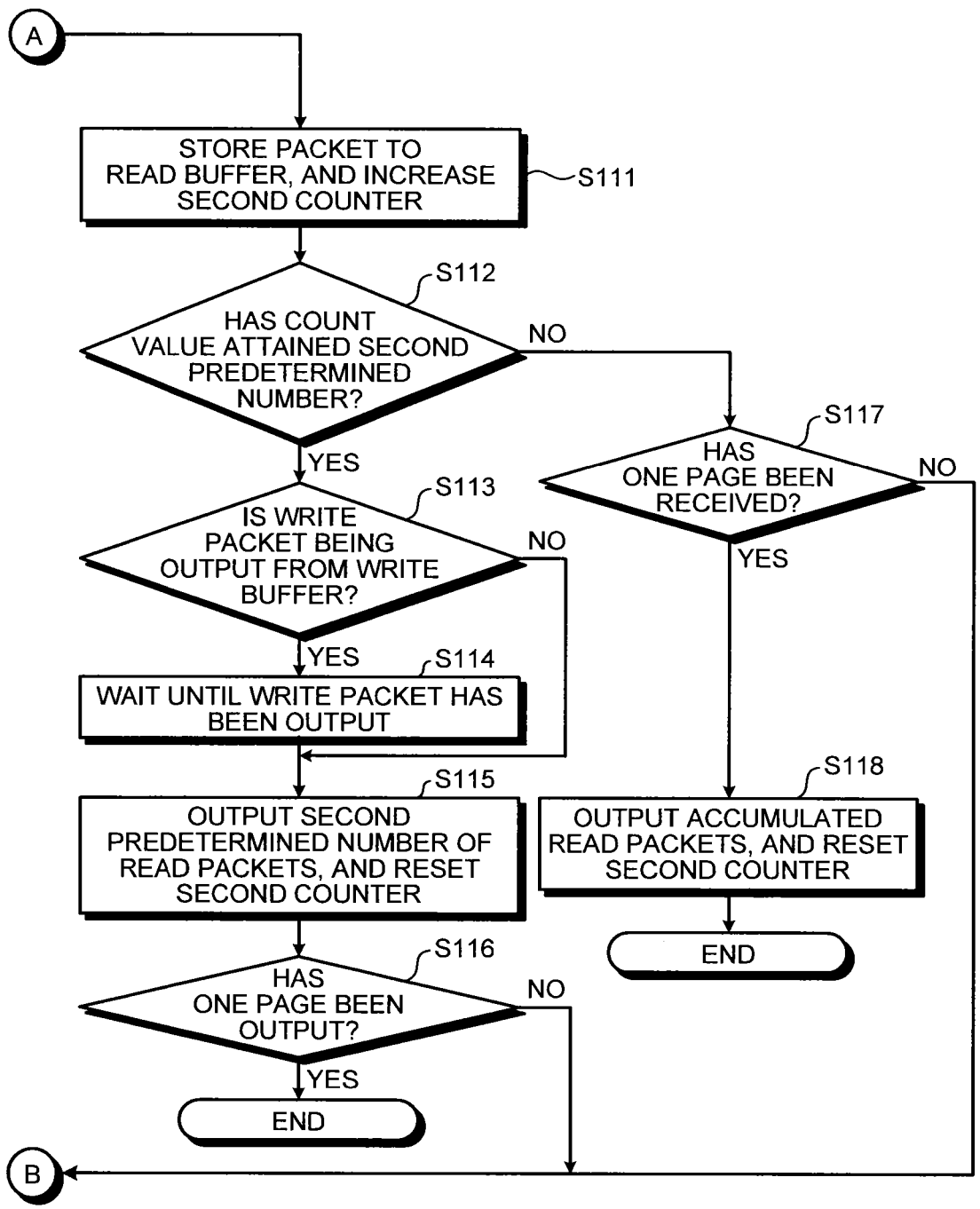

FIGS. 12A and 12B are flowcharts illustrating flow of processing performed by the sequence control unit 310 provided in the memory controller 30. The flowcharts of FIGS. 12A and 12B illustrate the flow of processing performed by the sequence control unit 310 up to completion of writing or reading of data of one page of image.

Step S101: the sequence control unit 310 receives packets included in a packet sequence in such an order that the sequence control unit 310 first receives the head of the packet sequence, and proceeds to step S102.

Step S102: the sequence control unit 310 determines whether the packet received in step S101 is a write packet or not. Then, the packet received in step S101 is a write packet (step S102: Yes), step S103 is subsequently performed. When the packet received in step S101 is a read packet (step S102: No), step S111 is subsequently performed.

Step S103: the sequence control unit 310 stores the write packet received in step S101 to the write buffer 311, increases a first counter, and proceeds to step S104. The first counter is a counter for counting a first predetermined value.

Step S104: the sequence control unit 310 determines whether the count value of the first counter has attained a first predetermined value. Then, when the count value of the first counter is determined to have attained the first predetermined value (step S104: Yes), step S105 is subsequently performed, and when the count value of the first counter is determined to be less than the first predetermined value (step S104: No), step S109 is subsequently performed.

Step S105: the sequence control unit 310 determines whether a read packet is being output from the read buffer 312 or not. Then, when the read packet is being output from the read buffer 312 (step S105: Yes), step S106 is subsequently performed, and when the read packet is not being output from the read buffer 312 (step S105: No), step S107 is subsequently performed.

Step S106: the sequence control unit 310 waits until the read packet has been output from the read buffer 312, and step S107 is subsequently performed.

Step S107: the sequence control unit 310 causes the write buffer 311 to successively output a first predetermined number of write packets accumulated in the write buffer 311, resets the first counter, and proceeds to step S108.

Step S108: the sequence control unit 310 determines whether writing or reading of data of one page of image has been completed or not. Then, when writing or reading of data of one page of image is determined to have been completed (step S108: Yes), the series of processing as illustrated in the flowcharts of FIGS. 12A and 12B is terminated. On the other hand, when writing or reading of data of one page of image is determined not to have been completed (step S108: No), the sequence control unit 310 returns back to step S101 to receive a subsequent packet, and repeats the processing of step S101 and subsequent steps.

Step S109: the sequence control unit 310 determines whether a write packet corresponding to data of one page of image has been received or not. When the write packet corresponding to data of one page of image is determined to have been received (step S109: Yes), step S110 is subsequently performed, and when the write packet corresponding to data of one page of image is determined not to have been received (step S109: No), the sequence control unit 310 returns back to step S101 to receive a subsequent packet, and repeats the processing of step S101 and subsequent steps.

Step S110: the sequence control unit 310 causes the write buffer 311 to successively output write packets accumulated in the write buffer 311 (write packets less than the first predetermined number), resets the first counter, and terminates the series of processing as illustrated in the flowcharts of FIGS. 12A and 12B.

Step S111: the sequence control unit 310 stores the read packet received in step S101 to the read buffer 312, increases a second counter, and proceeds to step S112. The second counter is a counter for counting a second predetermined value.

Step S112: the sequence control unit 310 determines whether the count value of the second counter has attained the second predetermined value. Then, when the count value of the second counter is determined to have attained the second predetermined value (step S112: Yes), step S113 is subsequently performed, and when the count value of the second counter is determined to be less than the second predetermined value (step S112: No), step S117 is subsequently performed.

Step S113: the sequence control unit 310 determines whether a write packet is being output from the write buffer 311 or not. Then, when the read packet is being output from the write buffer 311 (step S113: Yes), step S114 is subsequently performed, and when the write packet is not being output from the write buffer 311 (step S113: No), step S115 is subsequently performed.

Step S114: the sequence control unit 310 waits until the write packet has been output from the write buffer 311, and step S115 is subsequently performed.

Step S115: the sequence control unit 310 causes the read buffer 312 to successively output a second predetermined number read packets accumulated in the read buffer 312, resets the second counter, and proceeds to step S116.

Step S116: the sequence control unit 310 determines whether writing or reading of data of one page of image has been completed or not. Then, when writing or reading of data of one page of image is determined to have been completed (step S116: Yes), the series of processing as illustrated in the flowcharts of FIGS. 12A and 12B are terminated. On the other hand, when writing or reading of data of one page of image is determined not to have been completed (step S116: No), the sequence control unit 310 returns back to step S101 to receive a subsequent packet, and repeats the processing of step S101 and subsequent steps.

Step S117: the sequence control unit 310 determines whether a read packet corresponding to data of one page of image has been received or not. When the read packet corresponding to data of one page of image is determined to have been received (step S117: Yes), step S118 is subsequently performed, and when the read packet corresponding to data of one page of image is determined not to have been received (step S117: No), the sequence control unit 310 returns back to step S101 to receive a subsequent packet, and repeats the processing of step S101 and subsequent steps.

Step S118: the sequence control unit 310 causes the read buffer 312 to successively output read packets accumulated in the read buffer 312 (write packets less than the second predetermined number), resets the second counter, and terminates the series of processing as illustrated in the flowcharts of FIGS. 12A and 12B.

As described above, in the image forming system 100 according to the present embodiment, the memory controller 30 of the image forming apparatus 400 is provided with the sequence control unit 310 that changes the order of the packets included in the packet sequence so that the first predetermined number of write packets are arranged successively and the second predetermined number of read packets are arranged successively. Then, according to the order of arrangement changed by the sequence control unit 310, the write commands according to the write packets and the read commands according to the read packets are output from the memory control unit 320 to the frame memory 31. Therefore, this can reduce the number of times the waiting time for completion of command reception occurs during switching from writing to reading of data, and the data transfer efficiency can be improved. Therefore, an abnormal image can be prevented from being printed while complying with the above line synchronization constraints, and the data transfer in units of pages from the DFE apparatus 200 to the image forming apparatus 400 can be done efficiently, and successive printing of multiple pages can be performed continuously.

Subsequently, specific examples of the number of write packets accumulated in the write buffer 311 of the sequence control unit 310 (first predetermined number) and the number of read packets accumulated in the read buffer 312 (second predetermined number) will be explained in detail with reference to FIGS. 13A to 17.

The first predetermined number and the second predetermined number are set at the numbers at which both of the above condition 1 and the above condition 2 are satisfied. The possible ranges of the first predetermined number and the second predetermined number are determined from relationship between a line read target time read_line_time, a page write target time write_page_time, a time required to read one line of data (hereinafter referred to as "one-line read time") t_read_line1, and a time required to write one page of data (hereinafter referred to as "one-page write time") t_write_page1. The values line read target time read_line_time and page write target time write_page_time are values that are determined according to the performance of the printer engine 26 of the image forming apparatus 400. The values one-line read time t_read_line1 and one-page write time t_write_page1 can be calculated as follows.

First, the words used for calculation of one-line read time t_read_line1 and one-page write time t_write_page1 are defined as follows.

Figure 13A:
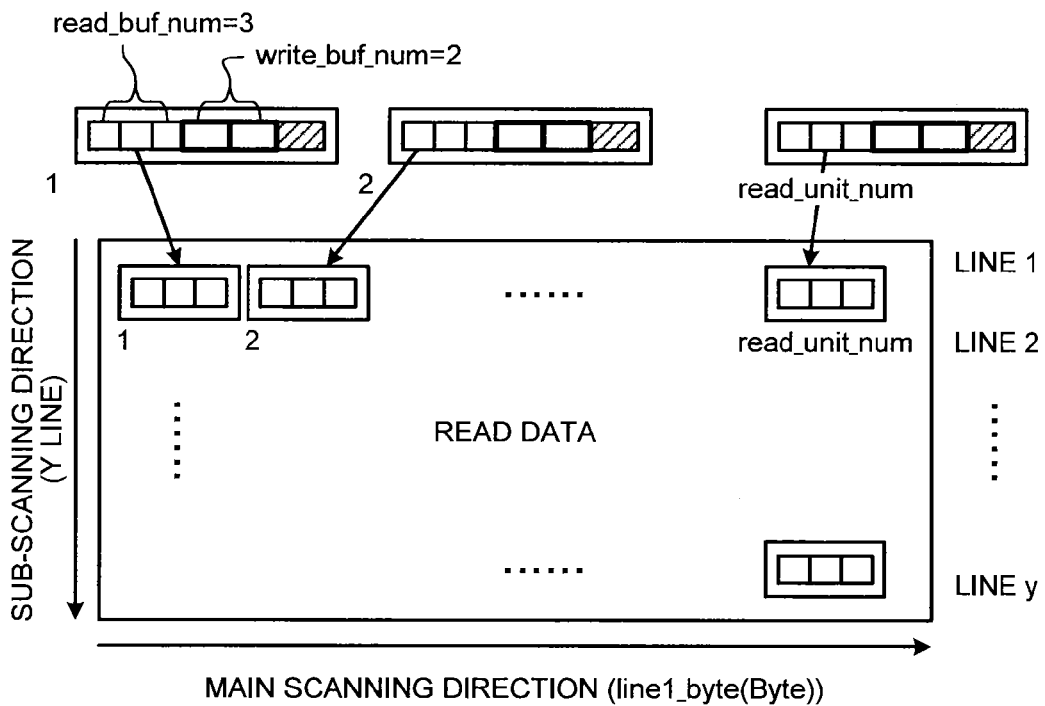
FIGS. 13A and 13B are figures explaining a concept of read unit num and write unit num used for calculating one-line read time and one-page write time.
Figure 13B:
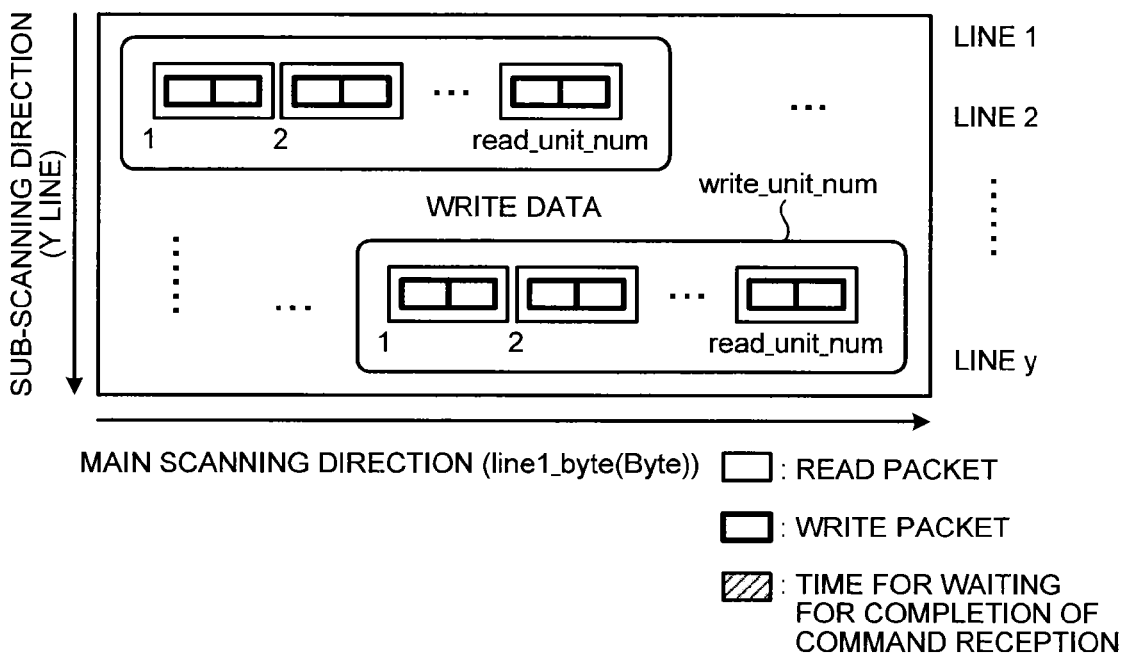

The number of bytes per line: line1_byte (Byte)
The number of bytes per page: page1_byte (Byte)
Size of read packet: read_size (Byte)
Size of write packet: write_size (Byte)
Time for each size of read packet: t_resd (s)
Time for each size of write packet: t_write (s)
Time for waiting for completion of command reception during switching from writing to reading of data: t_wait (s)
Waiting time occurring buffering and the like per read_unit_num: t_buf (s)
Read packet buffer accumulation number (second predetermined number): read_buf_num
Write packet buffer accumulation number (first predetermined number): write_buf_num Subsequently, an example of method for calculating one-line read time t_read_line1 and one-page write time t_write_page1 will be explained with reference to FIGS. 13A and 13B. FIGS. 13A and 13B are figures explaining a concept of read_unit_num and write_unit_num used for calculating one-line read time t_read_line1 and one-page write time t_write_page1. FIG. 13A is an explanatory diagram illustrating read_unit_num. FIG. 13B is an explanatory diagram illustrating write_unit_num.

read_unit_num denotes the number of units per line where the read packet buffer accumulation number read_buf_num is adopted as one unit. In other words, for example, as illustrated in FIG. 13A, read_unit_num represents how many units, each is a set of three read packets, are included in one line where read_buf_num is 3. read_unit_num can be represented as expression (1) below.

$$\text{read\_unit\_num} = \text{value obtained by rounding down} \\ (\text{line1\_byte}/(\text{read\_size} \times \text{read\_buf\_num})) \quad (1)$$

When this read_unit_num is used, one-line read time t_read_line1 can be expressed as expression (2) below.

$$t\_read\_line1 = \text{read\_unit\_num} \times (\text{read\_buf\_num} \times \\ t\_read + \text{write\_buf\_num} \times t\_write + t\_wait + t\_buf) + \alpha \quad (2)$$

It should be noted that $\alpha$ denotes a time equivalent to a remainder byte obtained by subtracting read_unit_num from the number of bytes per line line1_byte. For example, $\alpha$ can be expressed as expression (3) below.

$$\alpha = \text{ROUNDUP} ((\text{line1\_byte} - \text{read\_unit\_num} \times \\ \text{read\_buf\_num})/\text{read\_size}) \times t\_resd \quad (3)$$

ROUNDUP means obtaining an integer portion by rounding up the value.

write_unit_num denotes the number of units per page where read_unit_num sets of write packet buffer accumulation numbers write_buf_num is adopted as one unit. In other words, for example, as illustrated in FIG. 13B, write_unit_num represents how many units, each including read_unit_num sets of two write packets, are included in one page where write_buf_num is 2. write_unit_num can be represented as expression (4) below.

$$\text{write\_unit\_num} = \text{value obtained by rounding down} \\ (\text{page1\_byte}/(\text{write\_size} \times \text{write\_buf\_num} \times \\ \text{read\_unit\_num})) \quad (4)$$

When this write_unit_num is used, one-page write time t_write_page1 can be represented as expression (5) below.

$$t\_write\_page1 = \text{write\_unit\_num} \times t\_read\_line1 + \beta \quad (5)$$

It should be noted that $\beta$ is a time equivalent to a remainder byte obtained by subtracting the total number of bytes in unit of write_unit_num from the number of total bytes per page page1_byte. For example, $\beta$ can be expressed as expression (6) below.

$$\beta = \text{ROUNDUP} ((\text{page1\_byte} - \text{write\_size} \times \\ \text{write\_buf\_num} \times \text{read\_unit\_num} \times \text{write\_} \\ \text{unit\_num})/\text{write\_size}) \times t\_write \quad (6)$$

ROUNDUP means obtaining an integer portion by rounding up the value.

Figure 14:
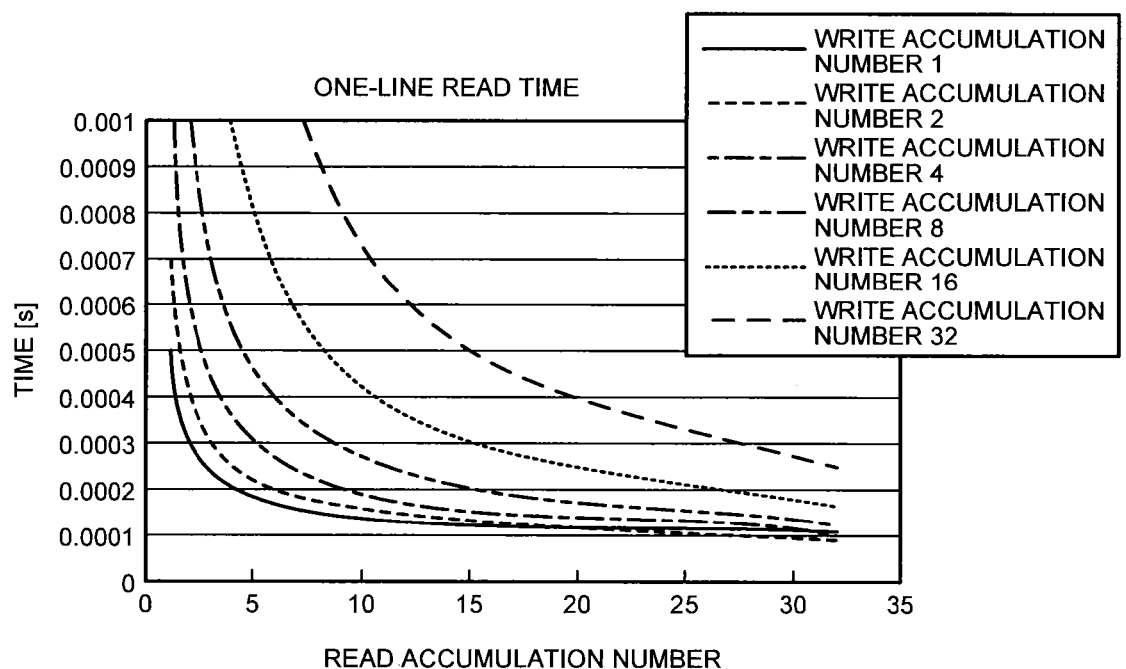
FIG. 14 is a graph illustrating relationship between the one-line read time and a read packet buffer accumulation number and a write packet buffer accumulation number.

FIG. 14 is a graph illustrating relationship between the one-line read time time t_read_line1 and the read packet buffer accumulation number read_buf_num and the write packet buffer accumulation number write_buf_num. A horizontal axis of FIG. 14 denotes the read packet buffer accumulation number read_buf_num, and a vertical axis thereof denotes the one-line read time t_read_line1. FIG. 14 illustrates, as a graph, the one-line read time t_read_line1 corresponding to the read packet buffer accumulation number read_buf_num, where, for example, the write packet buffer accumulation number write_buf_num is 1, 2, 4, 8, 16, 32.

Figure 15:
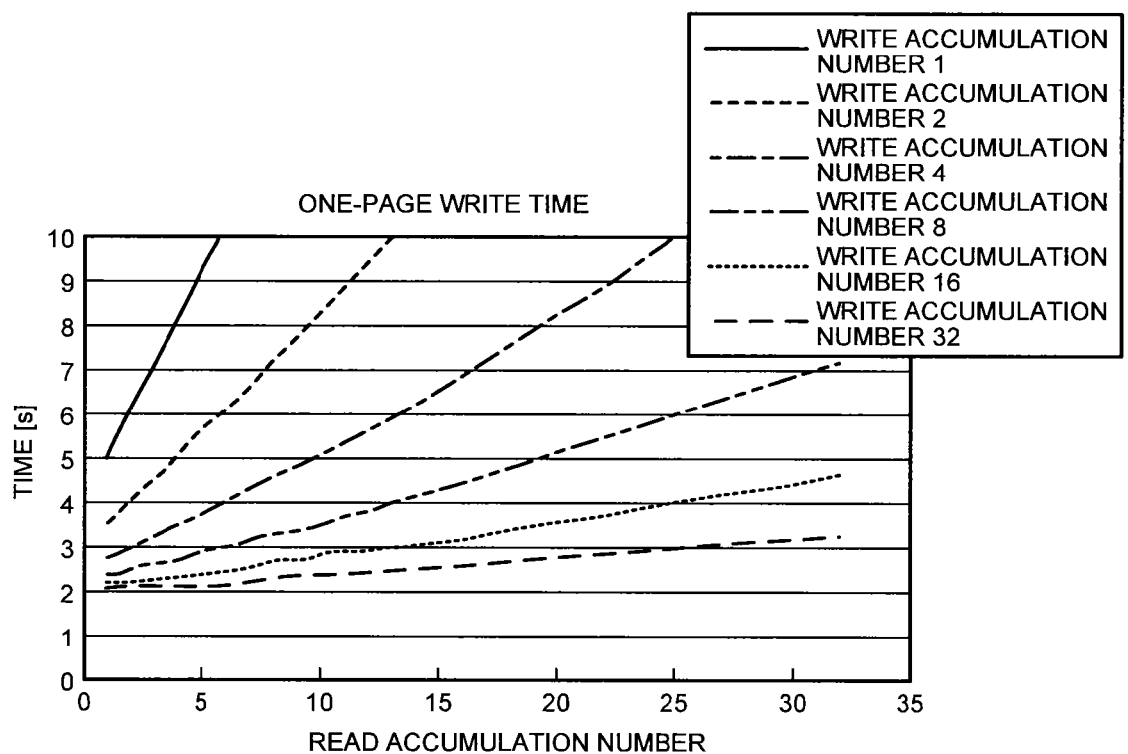
FIG. 15 is a graph illustrating relationship between the one-page write time and the read packet buffer accumulation number and the write packet buffer accumulation number.

FIG. 15 is a graph illustrating relationship between the one-page write time t_write_page1 and the read packet buffer accumulation number read_buf_num and the write packet buffer accumulation number write_buf_num. A horizontal axis of FIG. 15 denotes the read packet buffer accumulation number read_buf_num, and a vertical axis thereof denotes the one-page write time t_write_page1. FIG. 15 illustrates, as a graph, the one-page write time t_write_page1 corresponding to the read packet buffer accumulation number read_buf_num where, for example, the write packet buffer accumulation number write_buf_num is 1, 2, 4, 8, 16, 32.

Figure 16:
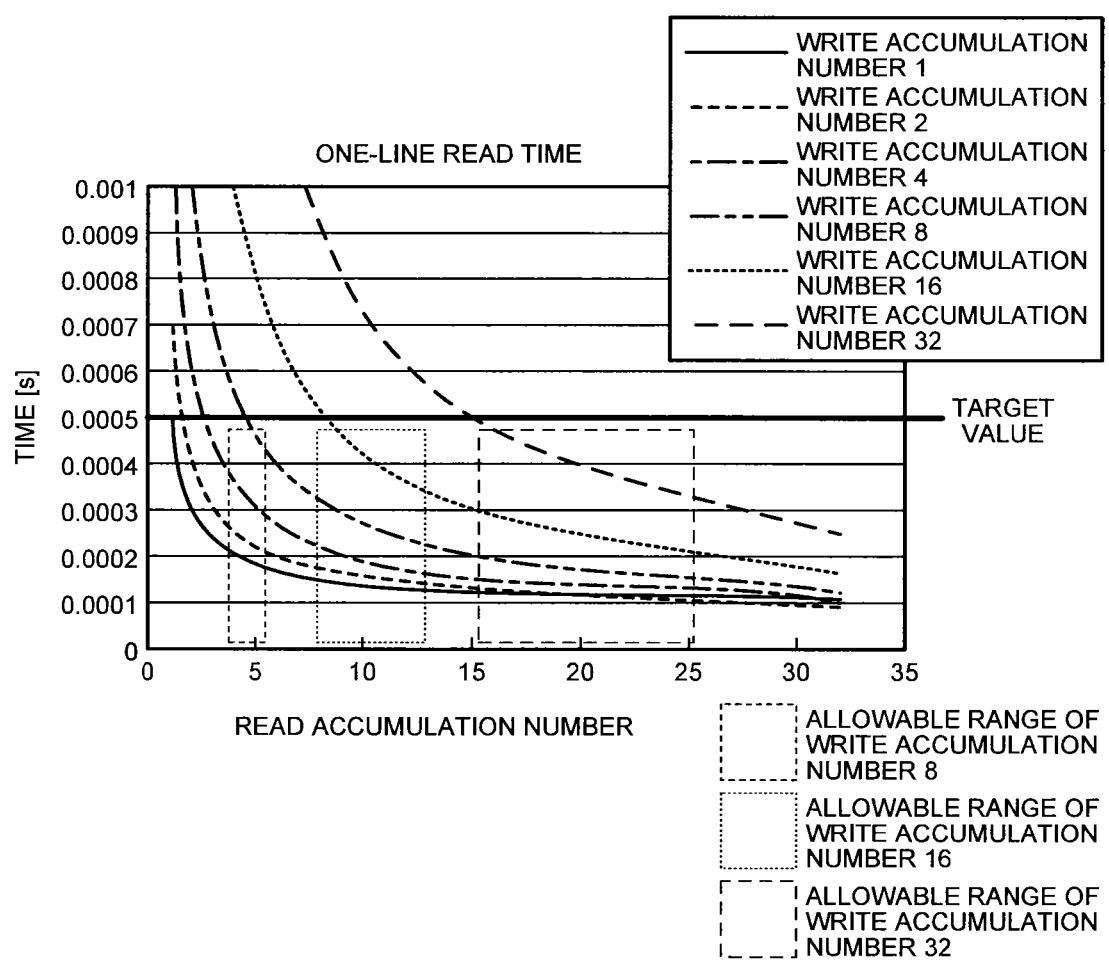
FIG. 16 is a figure explaining ranges of the read packet buffer accumulation number and the write packet buffer accumulation number where the one-line read time is equal to or less than a line read target time and the one-page write time is equal to or less than a page write target time.
Figure 17:
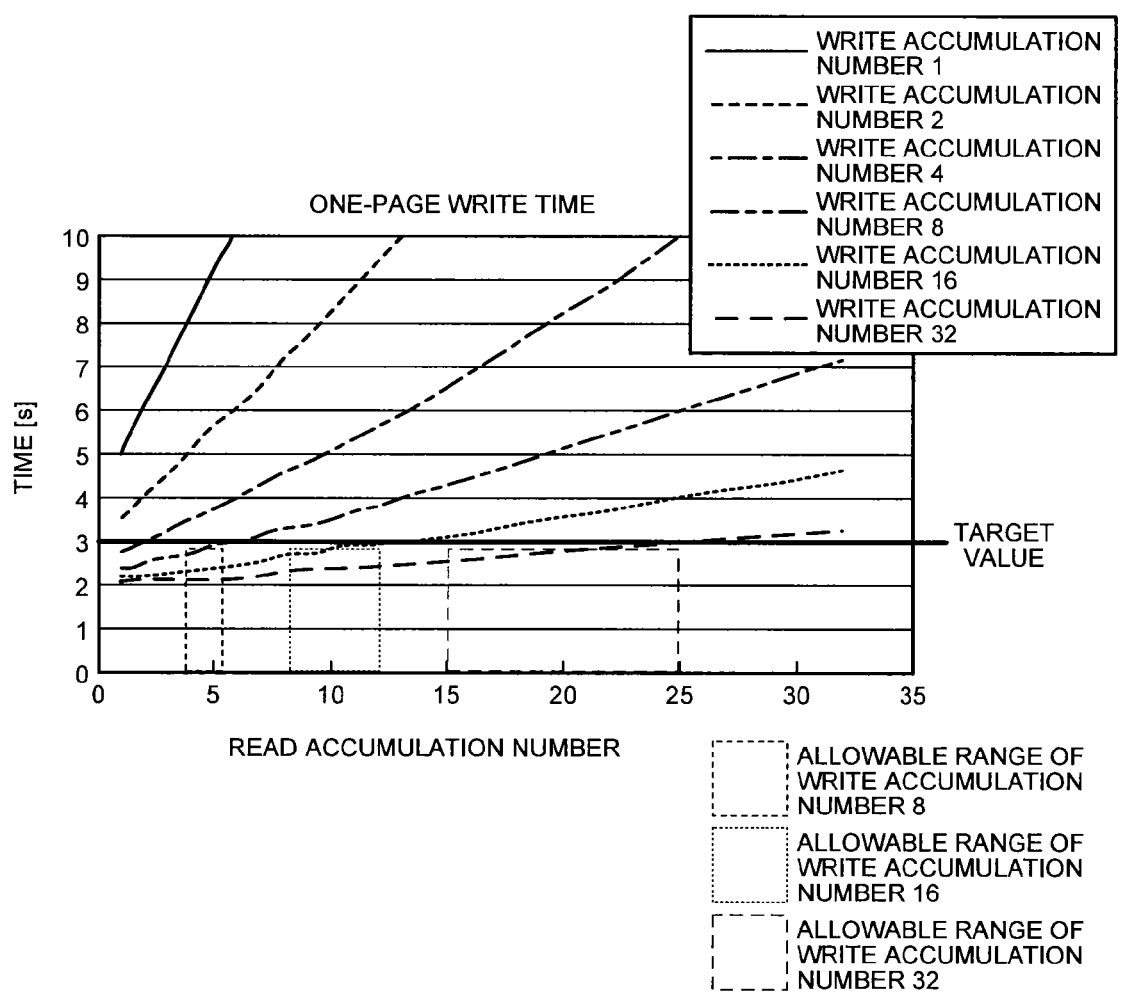
FIG. 17 is a figure explaining ranges of the read packet buffer accumulation number and the write packet buffer accumulation number where the one-line read time is equal to or less than the line read target time and the one-page write time is equal to or less than the page write target time.

FIGS. 16 and 17 are figures illustrating ranges of the read packet buffer accumulation number read_buf_num (second predetermined number) and the write packet buffer accumulation number write_buf_num (first predetermined number), where, in the graphs of FIGS. 14 and 15, the one-line read time t_read_line1 is equal to or less than a line read target time read_line_time (the above condition 1) and the one-page write time t_write_page1 is equal to or less than a page write target time write_page_time (the above condition 2). In FIG. 16, for example, the line read target time read_line_time is 0.0005 s. In FIG. 17, for example, the page write target time write_page_time is 3 s.

In each graph illustrated in FIG. 16, the read packet buffer accumulation number read_buf_num when the one-line read time t_read_line1 is equal to the line read target time read_line_time is a minimum value read_buf_num_min of the read packet buffer accumulation number. In each graph illustrated in FIG. 17, the read packet buffer accumulation number read_buf_num when the one-page write time t_write_page1 is equal to the page write target time write_page_time is a maximum value read_buf_num_max of the read packet buffer accumulation number. For any given write packet buffer accumulation number write_buf_num, a read packet buffer accumulation number read_buf_num between the minimum value read_buf_num_min and the maximum value read_buf_num_max is an allowable range of the read packet buffer accumulation number read_buf_num (second predetermined number) that satisfies both of the condition 1 and the condition 2 at the same time.

In FIGS. 16 and 17, frames of broken lines respectively represent the allowable ranges of the read packet buffer accumulation number read_buf_num when the write packet buffer accumulation number write_buf_num is 8, 16, 32. For example, when the write packet buffer accumulation number write_buf_num (first predetermined number) is 32, the allowable range of the read packet buffer accumulation number read_buf_num (second predetermined number) that satisfies both of the condition 1 and the condition 2 at the same time is about 15 to 25.

Hereinafter, a method of obtaining the allowable range of the read packet buffer accumulation number read_buf_num (second predetermined number) that satisfies both of the condition 1 and the condition 2 at the same will be explained specifically using an example where the write packet buffer accumulation number write_buf_num (first predetermined number) is 32.

It is assumed that the read packet buffer accumulation number read_buf_num (second predetermined number) is rn (in the example of FIGS. 15 and 16, rn=1 to 32), the write packet buffer accumulation number write_buf_num (first predetermined number) is 32, and the one-line read time where the read packet buffer accumulation number is rn is read_line_time32 (rn). Further, it is assumed that, where the write packet buffer accumulation number write_buf_num (first predetermined number) is 32, and the read packet buffer accumulation number is rn, the one-page write time is write_page_time32 (rn).

In view of the graph illustrated in FIG. 16, the minimum value of the read packet buffer accumulation number read_buf_num where the one-line read time read_line_time32 (rn) is equal to or less than the line read target time read_line_time is adopted as the minimum value read_buf_num_min of the read packet buffer accumulation number. In the example of FIG. 16, the read packet buffer accumulation number read_buf_num satisfying the condition (condition 1) is 15 to 32, and therefore, the minimum value among them, i.e., 15, is adopted as the minimum value read_buf_num_min of the read packet buffer accumulation number.

Subsequently, in view of the graph illustrated in FIG. 17, the maximum value of the read packet buffer accumulation number read_buf_num where the one-page write time write_page_time32 (rn) is equal to or less than the page write target time write_page_time is adopted as the maximum value read_buf_num_max of the read packet buffer accumulation number. In the example of FIG. 17, the read packet buffer accumulation number read_buf_num satisfying the condition (condition 2) is 1 to 25, and therefore, the maximum value among them, i.e., 25, is adopted as the maximum value read_buf_num_max of the read packet buffer accumulation number.

When, for any given write packet buffer accumulation number write_buf_num, the minimum value read_buf_num_min and the maximum value read_buf_num_max of the read packet buffer accumulation number thus obtained satisfy the relationship: read_buf_num_min≤read_buf_num_max, the range from the read_buf_num_min to the read_buf_num_max is the allowable range of the read packet buffer accumulation number read_buf_num (second predetermined number) that satisfies both of the condition 1 and the condition 2 at the same time with regard to the relationship with the any given write packet buffer accumulation number write_buf_num. On the other hand, when read_buf_num_min is more than read_buf_num_max, it is considered that the read packet buffer accumulation number read_buf_num satisfying both of the condition 1 and the condition 2 at the same time does not exist with regard to combination with the any given write packet buffer accumulation number write_buf_num. As described above, the write packet buffer accumulation number write_buf_num (first predetermined number) and the read packet buffer accumulation number read_buf_num (second predetermined number) can be determined to satisfy both of the condition 1 and the condition 2 at the same time. The determined write packet buffer accumulation number write_buf_num (first predetermined number) and the determined read packet buffer accumulation number read_buf_num (second predetermined number) are stored by the sequence control unit 310 to a storage unit such as an EEPROM, not shown, in the memory controller 30, for example.

Second Embodiment

Subsequently, the second embodiment will be explained. In an image forming system according to the second embodiment, the image forming apparatus 400 includes a memory controller 30' in place of the memory controller 30 explained in the first embodiment. It should be noted that the other elements are the same as those of the first embodiment. In the explanation below, the same elements as those of the first embodiment are denoted with the same reference numerals, and redundant description thereabout is omitted. Only the distinctive features of the second embodiment will be explained.

Figure 18:
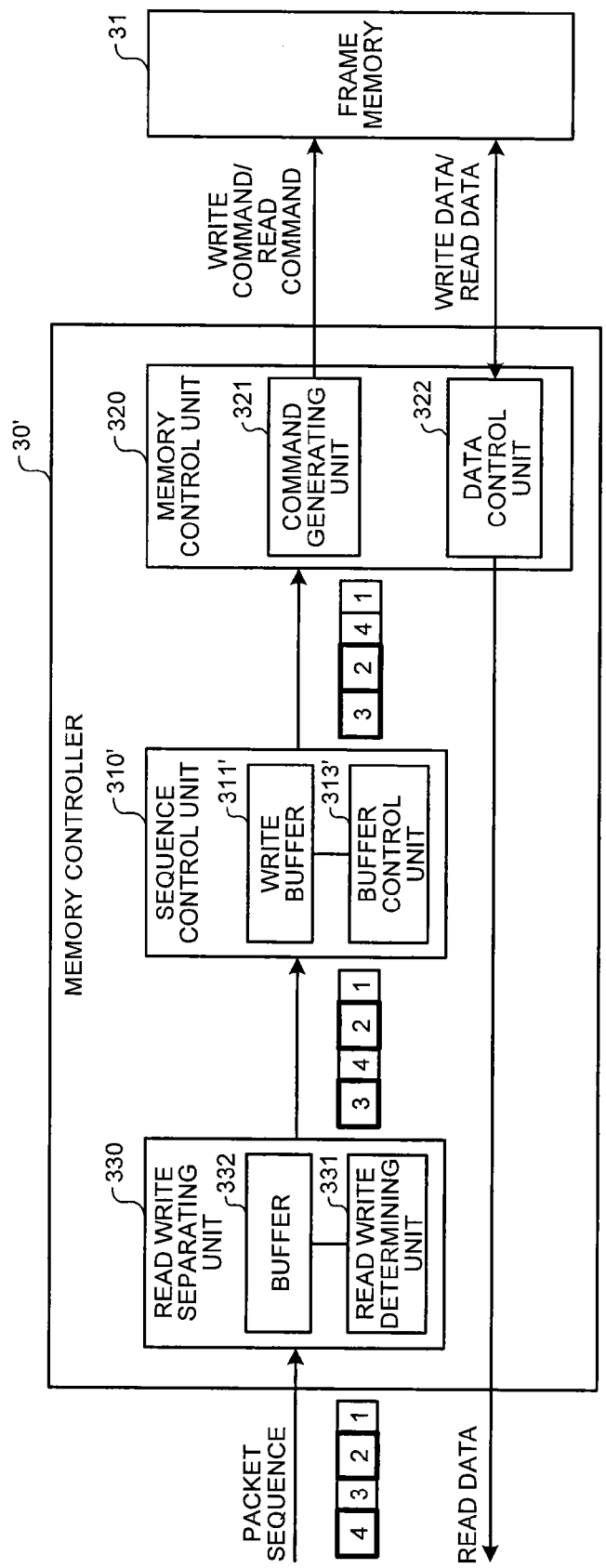
FIG. 18 is a block diagram illustrating an example of functional configuration of the memory controller.

FIG. 18 is a block diagram illustrating an example of functional configuration of the memory controller 30' provided in the image forming apparatus 400 according to the present embodiment. As illustrated in FIG. 18, the memory controller 30' includes a read write separating unit 330, a sequence control unit 310', and a memory control unit 320.

The read write separating unit 330 changes the arrangement of the write packets and the read packets included in the packet sequence that is input to the memory controller 30' so that the write packet and the read packets are arranged alternately one by one, and outputs the write packets and the read packets to the sequence control unit 310'. The read write separating unit 330 includes a read write determining unit 331 and a buffer 332.

The read write determining unit 331 distinguishes the write packets and the read packet included in the packet sequence that is input to the memory controller 30'. The read write determining unit 331 stores one of the write packet and the read packet, defined in advance, to the buffer 332, and temporarily holds the one of the write packet and the read packet defined in advance. Then, immediately after the other of the write packet and the read packet that is not temporarily stored to the buffer 332 (this is the read packet when the write packet is held by the buffer 332, and this is the write packet when the read packet is held by the buffer 332) is output from the read write separating unit 330, the read write determining unit 331 causes the read write separating unit 330 to output the one of the packet temporarily held in the buffer 332, so that the packet sequence that is output from the read write separating unit 330 is made into a packet sequence in which the write packets and the read packets are arranged alternately one by one.

The sequence control unit 310' includes a write buffer 311' and a buffer control unit 313'. The sequence control unit 310' according to the present embodiment is not provided with the read buffer 312 explained in the first embodiment.

The write buffer 311' accumulates, a predetermined number of write packets included in the packet sequence that is input from the read write separating unit 330 to the sequence control unit 310', and successively outputs the predetermined number of write packets accumulated. In this case, the predetermined number is a number satisfying both of the condition 1 and the condition 2 at the same time (except 1) when the first predetermined number and the second predetermined number explained in the first embodiment are the same.

When the write buffer 311' does not successively output the predetermined number of write packets, the buffer control unit 313' causes the read packets included in the packet sequence that is input from the read write separating unit 330 to the sequence control unit 310'.

The arrangement of the packets in the packet sequence that is input to the memory controller 30' is sorted by the processing performed by the sequence control unit 310'. Then, the packet sequence that is output from the sequence control unit 310' is such that a predetermined number of write packets are arranged successively and a predetermined number of read packets are arranged successively. For the sake of convenience, FIG. 18 illustrates an example where packets included in a packet sequence are sorted so that two write packets and two read packets are arranged successively. The packet sequence in which the packets are sorted by the sequence control unit 310' is input to the memory control unit 320.

The memory control unit 320 provided in the memory controller 30' according to the present embodiment is the same as the memory control unit 320 provided in the memory controller 30 according to the first embodiment, and detailed description about the memory control unit 320 is omitted.

Figure 19:
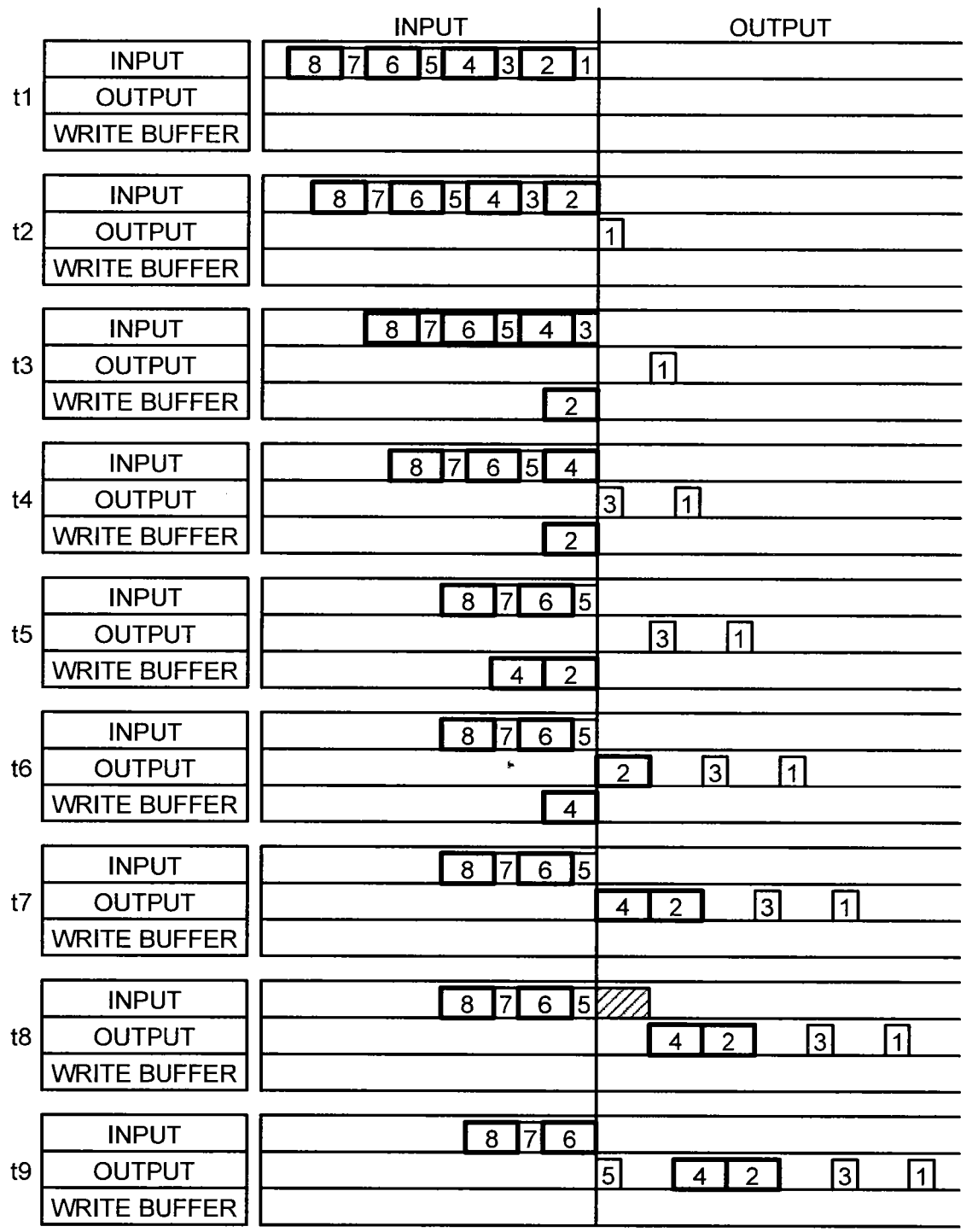
FIG. 19 is an explanatory diagram illustrating observation of a packet sequence which is input to a sequence control unit and a packet sequence which is output from a sequence control unit at each of times t1 to t9.

FIG. 19 is an explanatory diagram illustrating observation of a packet sequence which is input to the sequence control unit 310' and a packet sequence which is output from the sequence control unit 310' at each of times t1 to t9. FIG. 19 illustrates an example where the number of write packets accumulated in the write buffer 311' (predetermined number) is 2, and the sequence control unit 310' successively outputs the packet sequence in which two write packets and two read packets.

At the time t1, the read packet arranged at the head of the packet sequence in which read packets and write packets are alternately arranged one by one is input to the sequence control unit 310'.

At the time t2, the write packet arranged at the second position from the head of the packet sequence in which read packets and write packets are alternately arranged one by one is input to the sequence control unit 310'. At this occasion, the sequence control unit 310' outputs the read packet, which is arranged at the head of the packet sequence and was input to the sequence control unit 310' at the time t1.

At the time t3, the read packet arranged at the third position from the head of the packet sequence in which read packets and write packets are alternately arranged one by one is input to the sequence control unit 310'. At this occasion, the write packet, which is arranged at the second position from the head of the packet sequence and was input to the sequence control unit 310' at the time t2, is stored to the write buffer 311', and is not output from the sequence control unit 310'.

At the time time t4, the write packet arranged at the fourth position from the head of the packet sequence in which read packets and write packets are alternately arranged one by one is input to the sequence control unit 310'. At this occasion, the sequence control unit 310' outputs the read packet, which is arranged at the third position from the head of the packet sequence and was input to the sequence control unit 310' at the time t3.

At the time t5, the read packet arranged at the fifth position from the head of the packet sequence in which read packets and write packets are alternately arranged one by one is input to the sequence control unit 310'. At this occasion, the write packet, which is arranged at the fourth position from the head of the packet sequence and was input to the sequence control unit 310' at the time t4, is stored to the write buffer 311', and is not output from the sequence control unit 310'.

At the time t6, the sequence control unit 310' outputs the write packet, which is arranged at the second position from the head of the packet sequence and was input at the time t2 and is stored in the write buffer 311'. At this occasion, the fifth read packet, which was input at the time t5, is in output-waiting state, because the write packet is being output.

At the time t7, the sequence control unit 310' outputs the write packet, which is arranged at the fourth position from the head of the packet sequence and was input at the time t4 and is stored in the write buffer 311'. At this occasion, the fifth read packet, which was input at the time t5, is in output-waiting state, because the write packet is being output.

At the time t8, it takes time to wait for completion of command reception, and the fifth read packet, which was input at the time t5, is in the output waiting state.

At the time t9, the read packet arranged at the sixth position from the head of the packet sequence in which read packets and write packets are alternately arranged one by one is input to the sequence control unit 310'. At this occasion, the sequence control unit 310' outputs the fifth read packet, which was input at the time t5 is in output-waiting state.

Subsequently, the same operation is repeated, so that the sequence control unit 310' outputs the packet sequence in which two read packets and two write packets are successively arranged.

Figure 20:
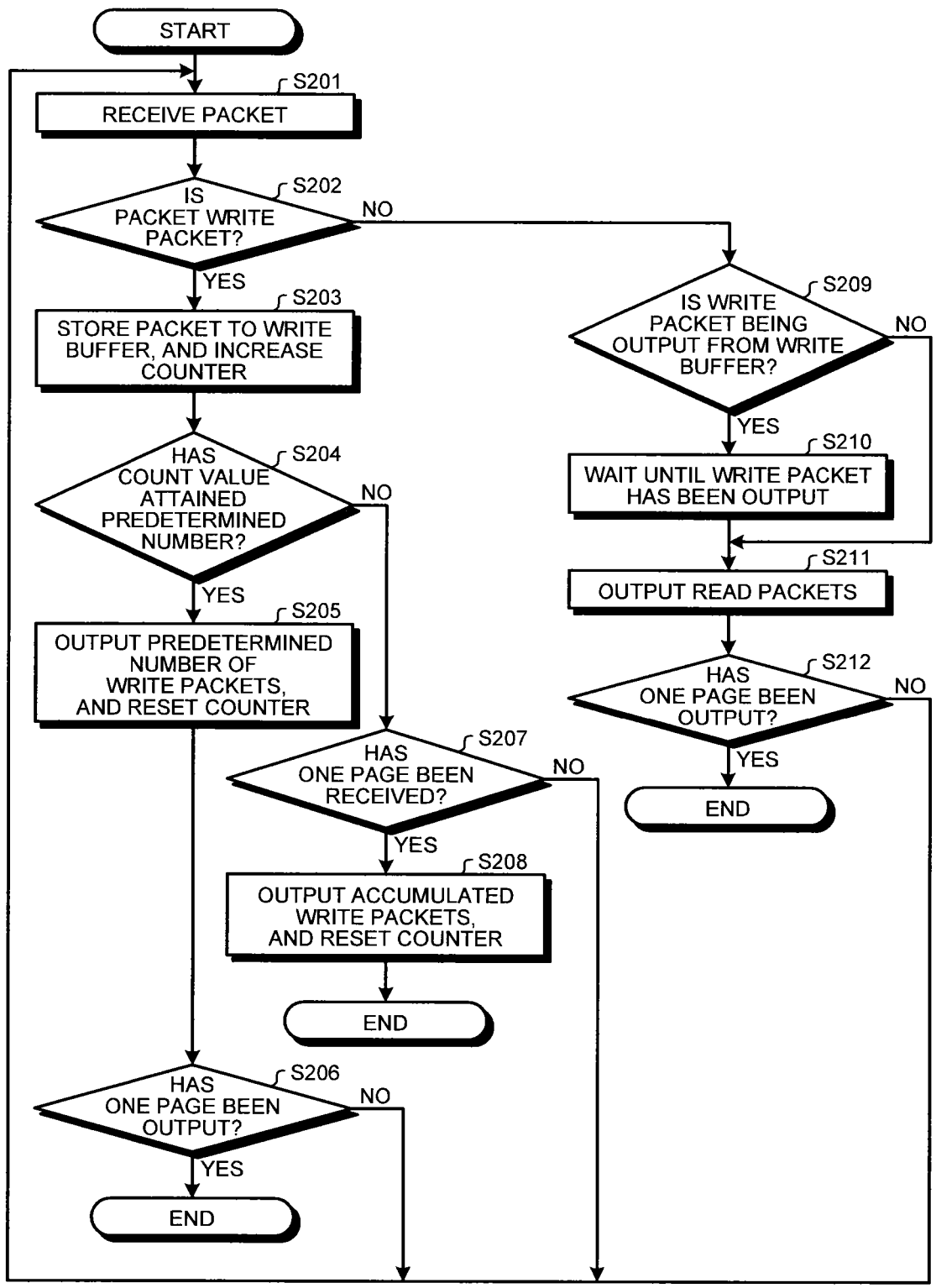
FIG. 20 is a flowchart illustrating flow of processing performed by the sequence control unit provided in the memory controller.

FIG. 20 is a flowchart illustrating flow of processing performed by the sequence control unit 310' provided in the memory controller 30' according to the present embodiment. The flowchart of FIG. 20 illustrates the flow of processing performed by the sequence control unit 310' up to completion of writing or reading of data for one page of image.

Step S201: the sequence control unit 310' receives the packets included in the packet sequence in order from the head of the packet sequence, and proceeds to step S202.

Step S202: the sequence control unit 310' determines whether the packet received in step S201 is a write packet or not. Then, when the packet received in step S201 is determined to be a write packet (step S202: Yes), the sequence control unit 310' proceeds to step S203. When the packet received in step S201 is determined to be a read packet (step S202: No), the sequence control unit 310' proceeds to step S209.

Step S203: the sequence control unit 310' stores the write packet received in step S201 to the write buffer 311', increases the counter, and proceeds to step S204. The counter is a counter for counting a predetermined value.

Step S204: the sequence control unit 310' determines whether the count value of the counter has attained the predetermined value. Then, when the count value of the counter is determined to have attained the predetermined value (step S204: Yes), the sequence control unit 310' proceeds to step S205, and when the count value of the counter is determined to be less than the predetermined value (step S204: No), the sequence control unit 310' proceeds to step S207.

Step S205: the sequence control unit 310' causes the write buffer 311' to successively output the predetermined number of write packet accumulated in the write buffer 311', resets the counter, and proceeds to step S206.

Step S206: the sequence control unit 310' determines whether writing or reading of data of one page of image has been completed or not. Then, when writing or reading of data of one page of image is determined to have been completed (step S206: Yes), the series of processing as illustrated in the flowchart of FIG. 20 is terminated. On the other hand, when writing or reading of data of one page of image is determined not to have been completed (step S206: No), the sequence control unit 310' returns back to step S201 to receive a subsequent packet, and repeats the processing of step S201 and subsequent steps.

Step S207: the sequence control unit 310' determines whether a write packet corresponding to data of one page of image has been received or not. When the write packet corresponding to data of one page of image is determined to have been received (step S207: Yes), step S208 is subsequently performed, and when the write packet corresponding to data of one page of image is determined not to have been received (step S207: No), the sequence control unit 310' returns back to step S201 to receive a subsequent packet, and repeats the processing of step S201 and subsequent steps.

Step S208: the sequence control unit 310' causes the write buffer 311' to successively output write packets accumulated in the write buffer 311' (write packets less than the predetermined number), resets the counter, and terminates the series of processing as illustrated in the flowchart of FIG. 20.

Step S209: the sequence control unit 310' determines whether a write packet is being output from the write buffer 311' or not. Then, when the write packet is being output from the read write 311' (step S209: Yes), step S210 is subsequently performed, and when the write packet is not being output from the write buffer 311' (step S209: No), step S211 is subsequently performed.

Step S210: sequence control unit 310' waits until the write packet has been output from the write buffer 311', and proceeds to step S211.

Step S211: the sequence control unit 310' outputs the read packet received in step S201, and proceeds to step S212.

Step S212: the sequence control unit 310' determines whether writing or reading of data of one page of image has been completed or not. Then, when writing or reading of data of one page of image is determined to have been completed (step S212: Yes), the series of processing as illustrated in the flowchart of FIG. 20 is terminated. On the other hand, when writing or reading of data of one page of image is determined not to have been completed (step S212: No), the sequence control unit 310' returns back to step S201 to receive a subsequent packet, and repeats the processing of step S201 and subsequent steps.

As described above, in the image forming system 100 according to the present embodiment, the memory controller 30 of the image forming apparatus 400' is provided with the read write separating unit 330 that changes the order of the packets in the packet sequence so that the write packets and the read packets are arranged alternately one by one and the sequence control unit 310' that receives the packet sequence from the read write separating unit 330 and changes the order of the packets in the packet sequence so that the predetermined number of write packets and read packets are arranged successively. Then, according to the order of arrangement changed by the sequence control unit 310', the write commands according to the write packets and the read commands according to the read packets are output from the memory control unit 320 to the frame memory 31. Therefore, like the first embodiment, this can reduce the number of times the waiting time for completion of command reception occurs during switching from writing to reading of data, and the data transfer efficiency can be improved. Therefore, an abnormal image can be prevented from being printed while complying with the above line synchronization constraints, and the data transfer in units of pages from the DFE apparatus 200 to the image forming apparatus 400 can be done efficiently, and successive printing of multiple pages can be performed continuously.

In the present embodiment, the following configuration has been explained as the configuration of the sequence control unit 310' of the memory controller 30': the sequence control unit 310' includes the write buffer 311' that accumulates the predetermined number of write packets included in the packet sequence provided from the read write separating unit 330 and successively outputs the predetermined number of write packets and the buffer control unit 313' that outputs the read packets included in the packet sequence provided from the read write separating unit 330 when the write buffer 311' does not successively output the predetermined number of write packets. However, the sequence control unit 310' may be configured to include a read buffer that accumulates a predetermined number of read packets included in a packet sequence provided from the read write separating unit 330 and successively outputs the predetermined number of read packets and a buffer control unit that outputs write packets included in the packet sequence provided from the read write separating unit 330 when the read buffer does not successively output the predetermined number of read packets. Even in this case, the sequence control unit 310' outputs a packet sequence in which a predetermined number of write packets and read packets are arranged successively, and therefore, the same effects as those explained above can be obtained in the same manner.

In the present embodiment, the read write separating unit 330 of the memory controller 30' changes the order of arrangement of packets in the packet sequence so that the read packets and write packets are alternately arranged one by one. Alternatively, the read write separating unit 330 may change the order of arrangement of packets in the packet sequence so that one write packet and the second predetermined number of read packets explained in the first embodiment are arranged alternately. In this case, when the write buffer 311' of the sequence control unit 310' is configured to accumulate the first predetermined number of write packets explained in the first embodiment and successively output the first predetermined number of write packets, the number of write packets arranged successively (first predetermined number) and the number of read packets arranged successively (second predetermined number) can be set at different numbers like the first embodiment, and this improves the versatility.

In contrast to the above example, the read write separating unit 330 may change the order of arrangement of packets in the packet sequence so that one read packet and the first predetermined number of write packets are arranged alternately. In this case, when a read buffer is provided instead of the write buffer 311' of the sequence control unit 310', and the read buffer is configured to accumulate the second predetermined number of read packets and successively output the second predetermined number of read packets, the number of write packets arranged successively (first predetermined number) and the number of read packets arranged successively (second predetermined number) can be set at different numbers like the first embodiment, and this improves the versatility.

The specific embodiments of the present invention have been hereinabove explained in detail. However, the present invention is not limited to the above embodiments as they are. The constituent elements may be changed and embodied without deviating from the gist of the present invention when the present invention is carried out. For example, in the explanation about each of the above embodiments, the raster image data are transferred according to the protocol of the PCIe standard, but the method of the data transfer is not limited thereto.

According to the present embodiments, there is an advantage in that highly efficient data transfer can be achieved by performing writing and reading of data to/from memory at a high speed even when writing and reading of data to/from the memory are performed alternately in a time division manner.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A memory control apparatus that controls writing and reading of data to/from a memory, the memory control apparatus comprising:
    a sequence control unit that receives a packet sequence including a write packet including a write request of data and a read packet including a read request of the data, and changes an arrangement of the write packet and the read packet included in the packet sequence so that a first predetermined number of write packets are arranged successively and a second predetermined number of read packets are arranged successively; and
    a command output unit that receives the packet sequence from the sequence control unit, and outputs a write command according to the write packet and a read command according to the read packet to the memory, in accordance with an order of arrangement of the write packet and the read packet,
    wherein the memory is an image memory storing image data,
    the first predetermined number and the second predetermined number are numbers that satisfies both of a first condition and a second condition at a same time,
    the first condition is such that a time it takes to read image data for one line in a horizontal direction of an image from the memory is equal to or less than a first target time, and
    the second condition is such that a time it takes to write image data for one page of an image to the memory is equal to or less than a second target time.

2. The memory control apparatus according to claim 1, wherein the sequence control unit includes:
    a first buffer that accumulates the first predetermined number of write packets, and successively outputs the first predetermined number of write packets accumulated;
    a second buffer that accumulates the second predetermined number of read packets, and successively outputs the second predetermined number of read packets accumulated; and
    a buffer control unit that causes the second buffer to successively output the second predetermined number of read packets when the first buffer does not successively output the first predetermined number of write packets, and causes the first buffer to successively output the first predetermined number of write packets when the second buffer does not successively output the second predetermined number of read packets.

3. The memory control apparatus according to claim 1, wherein each of the first predetermined number and the second predetermined number are a same predetermined number except one;
    the memory control apparatus further comprises a read write separating unit that changes an arrangement of the write packet and the read packet included in the packet sequence so that the write packet and the read packet are arranged alternately one by one, and outputs the packet sequence to the sequence control unit, and
    the sequence control unit includes:
    a buffer that accumulates the predetermined number of write packet, and successively outputs the predetermined number of write packet; and
    a buffer control unit that causes the buffer to output without accumulating the read packet included in the packet sequence received from the read write separating unit when the buffer does not successively output the predetermined number of write packets.

4. The memory control apparatus according to claim 1, wherein each of the first predetermined number and the second predetermined number are a same predetermined number except one;

the memory control apparatus further comprises a read write separating unit that changes an arrangement of the write packet and the read packet included in the packet sequence so that the write packet and the read packet are arranged alternately one by one, and outputs the packet sequence to the sequence control unit, and the sequence control unit includes:

a buffer that accumulates the predetermined number of read packet, and successively outputs the predetermined number of read packet; and a buffer control unit that causes the buffer to output without accumulating the write packet included in the packet sequence received from the read write separating unit when the buffer does not successively output the predetermined number of read packets.

5. The memory control apparatus according to claim 1, wherein the memory is SDRAM.

6. An information processing apparatus, comprising:

a memory;

a memory control unit that controls writing and reading of data to/from the memory; and a processing unit that executes predetermined processing, based on the data that is read out from the memory, wherein the memory control unit includes:

a sequence control unit that receives a packet sequence including a write packet including a write request of data and a read packet including a read request of the data, and changes an arrangement of the write packet and the read packet included in the packet sequence so that a first predetermined number of write packets are arranged successively and a second predetermined number of read packets are arranged successively; and a command output unit that receives the packet sequence from the sequence control unit, and outputs a write command according to the write packet and a read command according to the read packet to the memory, in accordance with an order of arrangement of the write packet and the read packet, wherein the memory is an image memory storing image data, the processing unit is a plotter that forms an image on a recording medium, based on the image data, the first predetermined number and the second predetermined number are numbers that satisfies both of a first condition and a second condition at a same time, the first condition is such that a time it takes to read image data for one line in a horizontal direction of an image from the memory is equal to or less than a first target time obtained from a performance of the plotter, and the second condition is such that a time it takes to write image data for one page of an image to the memory is equal to or less than a second target time obtained from the performance of the plotter.

7. A memory control method performed by a memory control apparatus that controls writing and reading of data to/from a memory, the memory control method comprising:

receiving a packet sequence including a write packet including a write request of data and a read packet including a read request of the data;

changing an arrangement of the write packet and the read packet included in the packet sequence so that a first predetermined number of write packets are arranged successively and a second predetermined number of read packets are arranged successively;

receiving the packet sequence, of which arrangement of the write packet and the read packet has been changed; and outputting a write command according to the write packet a read command according to the read packet to the memory, in accordance with an order of arrangement of the write packet and the read packet, wherein the memory is an image memory storing image data, the first predetermined number and the second predetermined number are numbers that satisfies both of a first condition and a second condition at a same time, the first condition is such that a time it takes to read image data for one line in a horizontal direction of an image from the memory is equal to or less than a first target time, and the second condition is such that a time it takes to write image data for one page of an image to the memory is equal to or less than a second target time.

* * * * *